United States Patent
Miyajima et al.

(10) Patent No.: US 7,577,174 B2
(45) Date of Patent: Aug. 18, 2009

(54) SEMICONDUCTOR LASER DEVICE AND SEMICONDUCTOR LASER ELEMENT ARRAY

(75) Inventors: Hirofumi Miyajima, Hamamatsu (JP); Akiyoshi Watanabe, Hamamatsu (JP); Hirofumi Kan, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 211 days.

(21) Appl. No.: 11/596,249

(22) PCT Filed: Jun. 23, 2005

(86) PCT No.: PCT/JP2005/011547
§ 371 (c)(1),
(2), (4) Date: Nov. 13, 2006

(87) PCT Pub. No.: WO2006/001339
PCT Pub. Date: Jan. 5, 2006

(65) Prior Publication Data
US 2007/0230528 A1    Oct. 4, 2007

(30) Foreign Application Priority Data
Jun. 24, 2004    (JP)    ............................. 2004-186908

(51) Int. Cl.
*H01S 5/10*    (2006.01)
(52) U.S. Cl. ................................. 372/45.01; 372/43.01
(58) Field of Classification Search ............... 372/43.01, 372/45.01
See application file for complete search history.

(56) References Cited

U.S. PATENT DOCUMENTS 5,022,036 A * 6/1991 Suyama et al. ........... 372/45.01
5,661,743 A * 8/1997 Nagai ....................... 372/46.01
6,292,502 B1 * 9/2001 Shimada ................... 372/45.01

FOREIGN PATENT DOCUMENTS

| JP | 1-165189 | 6/1989 |
|---|---|---|
| JP | 2-214181 | 8/1990 |
| JP | 2-260488 | 10/1990 |
| JP | 10-41582 | 2/1998 |
| JP | 10-51076 | 2/1998 |
| JP | 2000-114660 | 4/2000 |
| WO | 00/48277 | 8/2000 |

* cited by examiner

*Primary Examiner*—Minsun Harvey
*Assistant Examiner*—Michael Carter
(74) *Attorney, Agent, or Firm*—Drinker Biddle & Reath LLP

(57) ABSTRACT

The present invention relates to, for example, a semiconductor laser element capable of emitting laser beams having a small emitting angle efficiently with a simpler structure. The semiconductor laser element includes a first semiconductor portion, an active layer, and a second semiconductor portion. The first semiconductor portion has a ridge portion for forming a refractive index type waveguide region in the active layer. The waveguide region includes, at least, first and second portions having respective different total reflection critical angles at the side surfaces thereof. The first and second portions are arranged in such a manner that the relative angle of the side surfaces thereof to a light emitting surface and a light reflecting surface that are positioned at either end of the active layer is greater than the total reflection critical angle at the side surfaces. In this case, the relative angle of the side surfaces in the first portion to the light emitting surface and light reflecting surface is different from the relative angle of the side surfaces in the second portion to the light emitting surface and light reflecting surface.

15 Claims, 24 Drawing Sheets

Fig.1
(a)
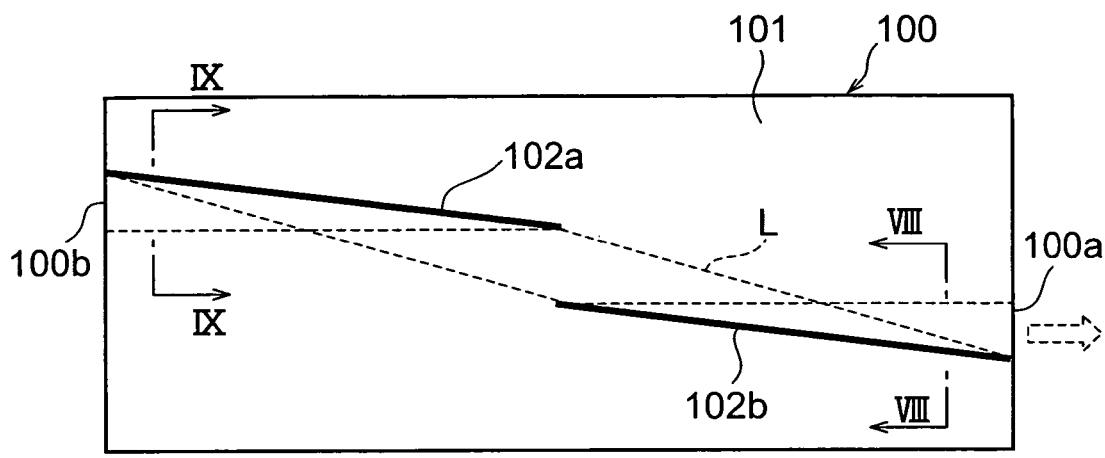
(b)
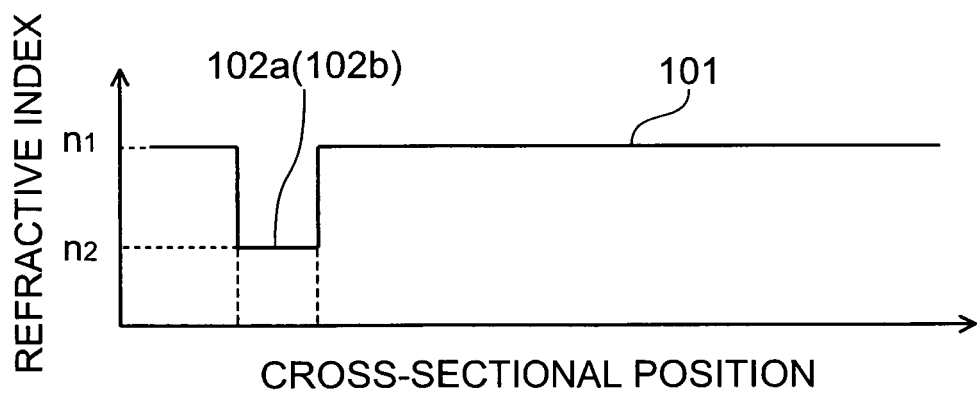

Fig.3
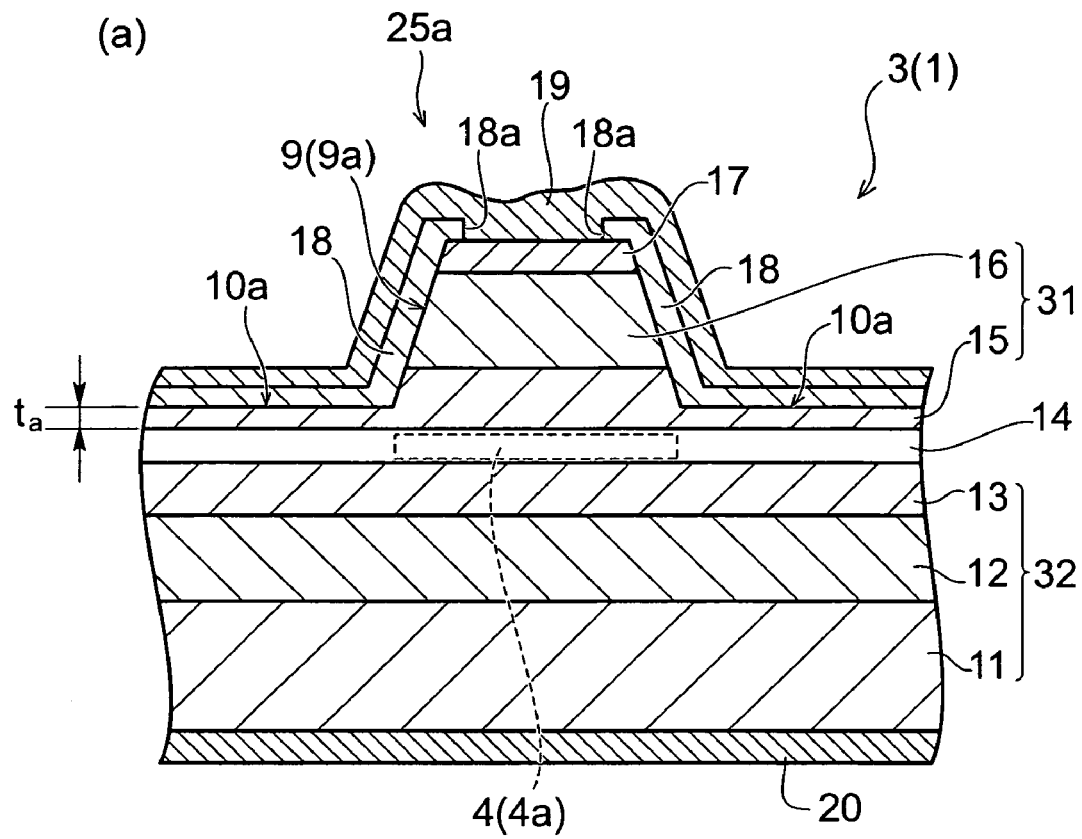
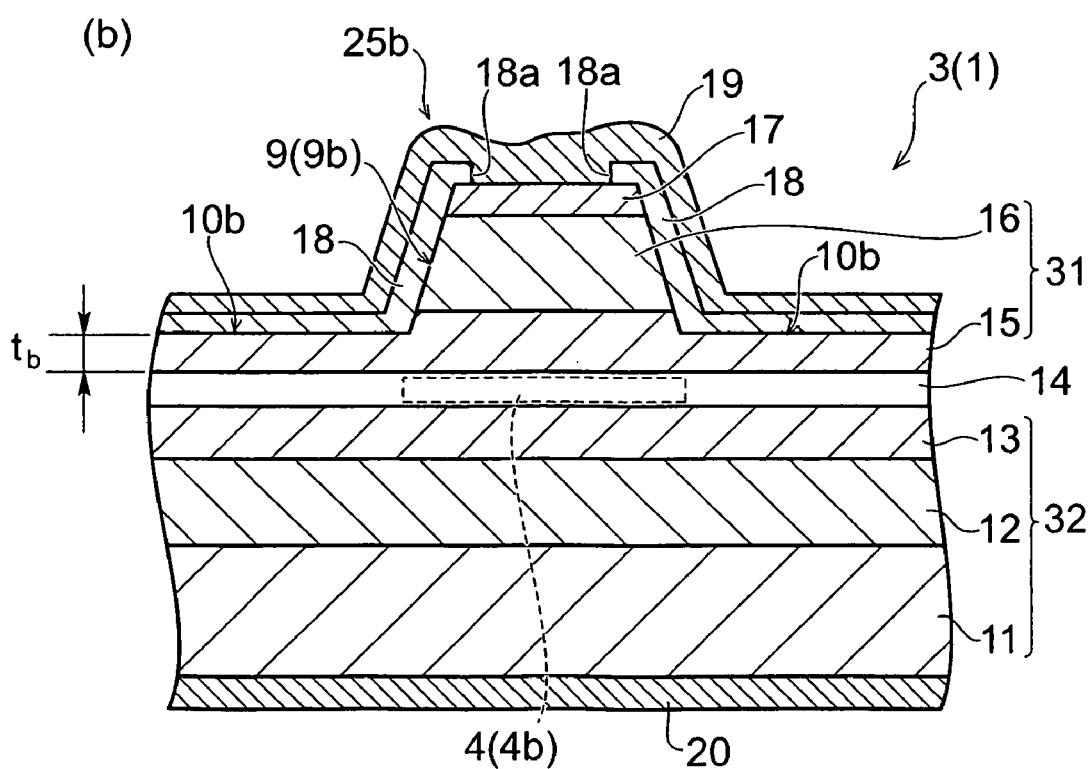

| | COMBINATION 1 | COMBINATION 2 | COMBINATION 3 |
|---|---|---|---|
| p-TYPE CLADDING LAYER | AlGaAs | AlGaAs | AlGaInP |
| FIRST OPTICAL GUIDING LAYER | GaAs | AlGaAs | InGaP |
| ACTIVE LAYER | InGaAs | AlGaAs | InGaAsP |
| SECOND OPTICAL GUIDING LAYER | GaAs | AlGaAs | InGaP |
| n-TYPE CLADDING LAYER | AlGaAs | AlGaAs | AlGaInP |

(b)

| | COMPOSITION | THICKNESS |
|---|---|---|
| p-TYPE CLADDING LAYER | $Al_{0.3}Ga_{0.65}As$ | 1.2 μm |
| FIRST OPTICAL GUIDING LAYER | $Al_{0.15}Ga_{0.85}As$ | 0.4 μm |
| ACTIVE LAYER | $In_{0.2}GaAs$ | 80 Å (QUANTUM WELL STRUCTURE) |
| SECOND OPTICAL GUIDING LAYER | $Al_{0.15}Ga_{0.85}As$ | 0.4 μm |
| n-TYPE CLADDING LAYER | $Al_{0.3}Ga_{0.65}As$ | 1.2 μm |

Fig.9
(a)
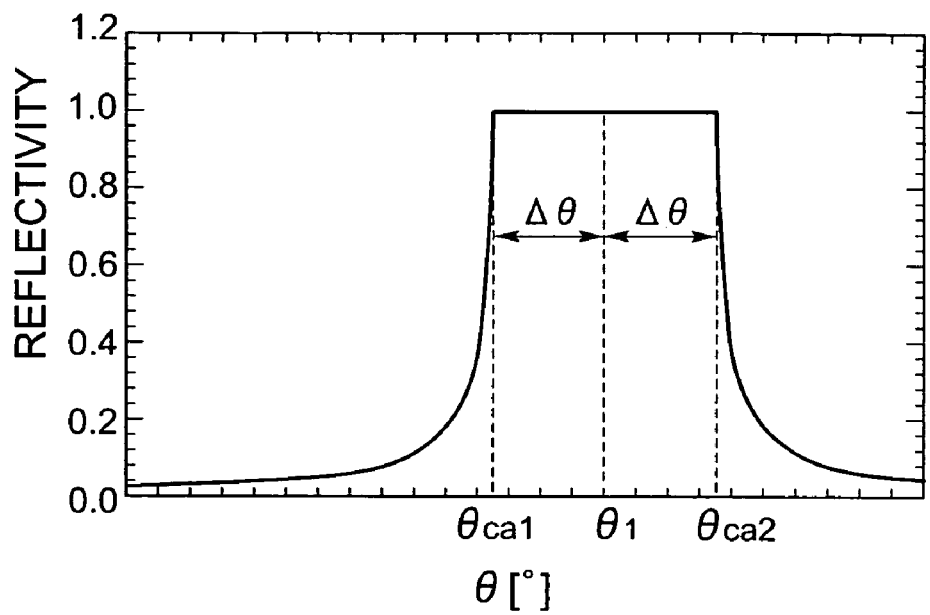
(b)
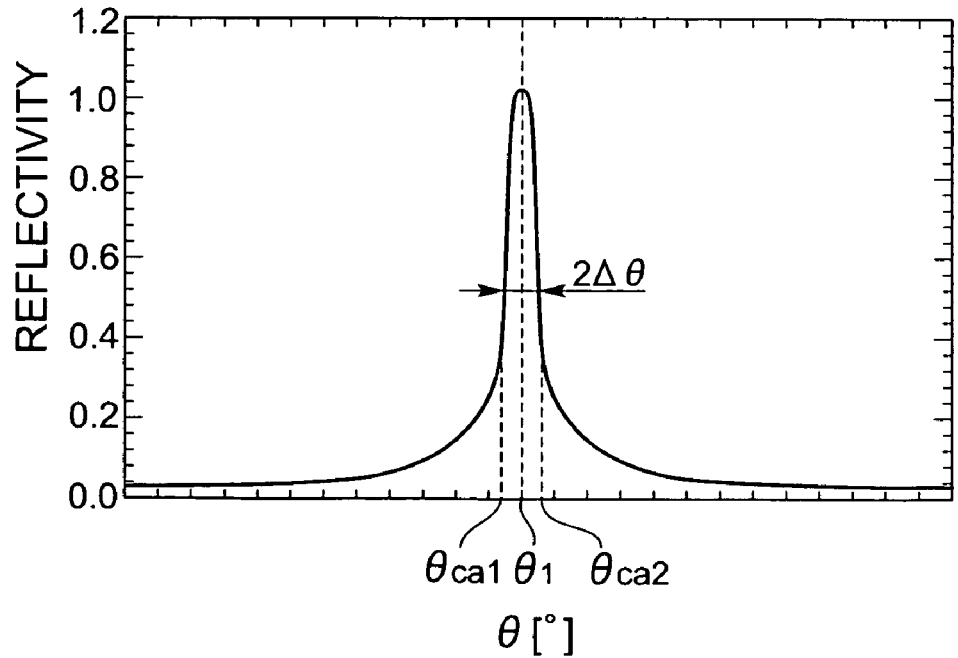

Fig.16
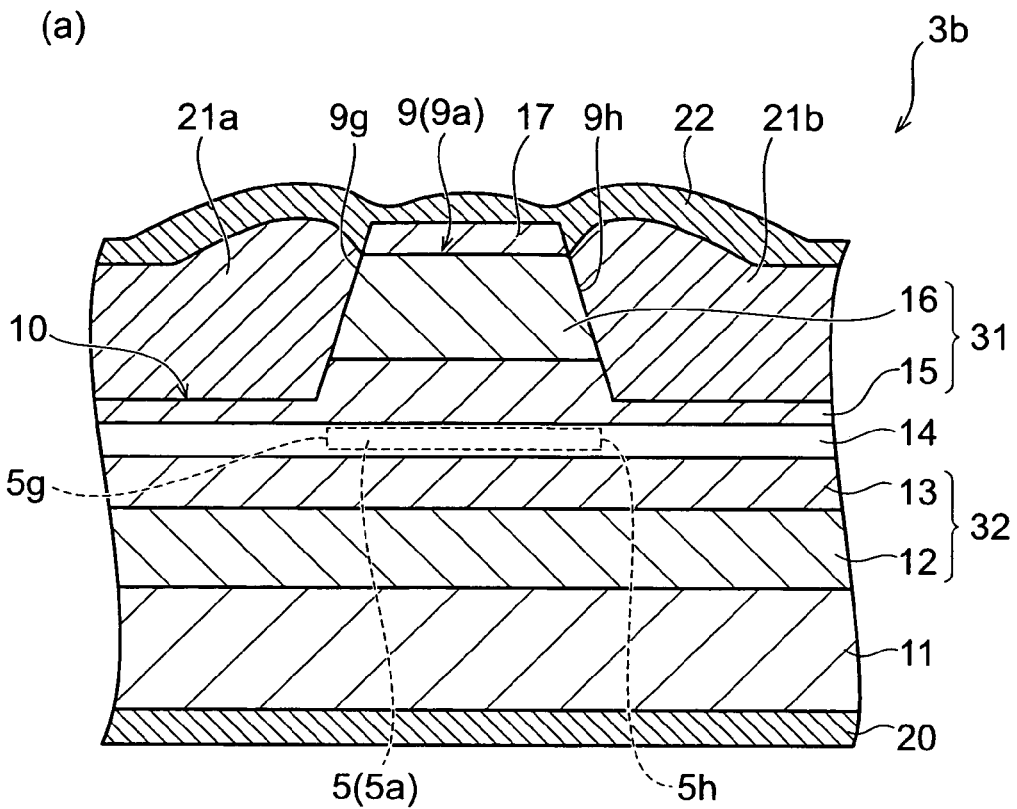
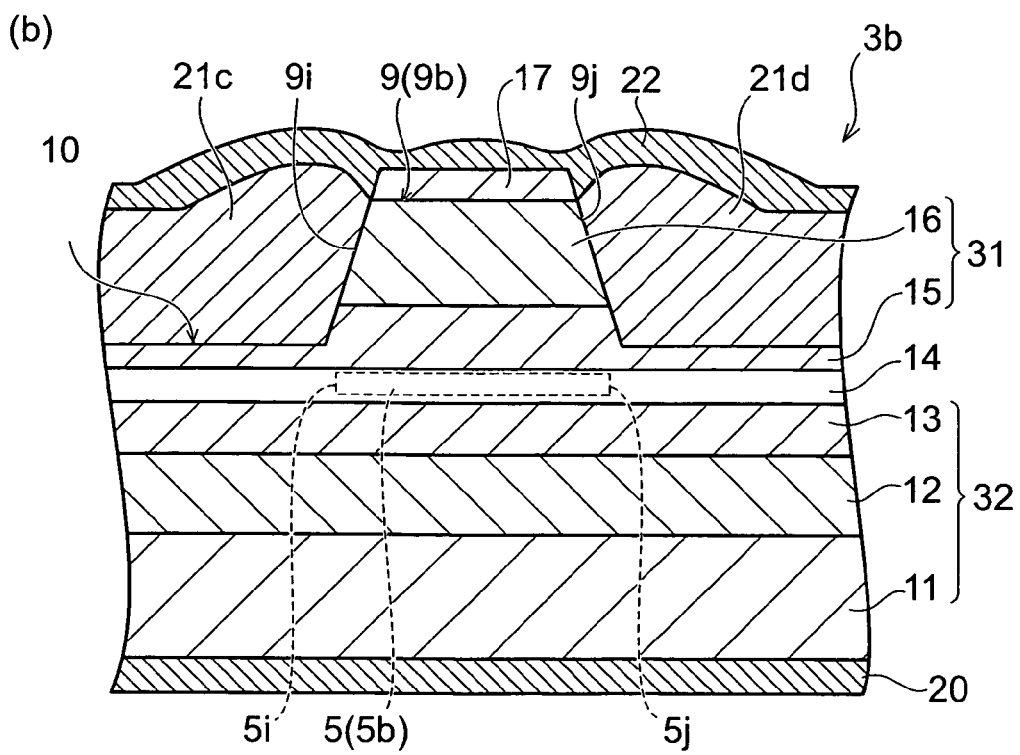

Fig.17
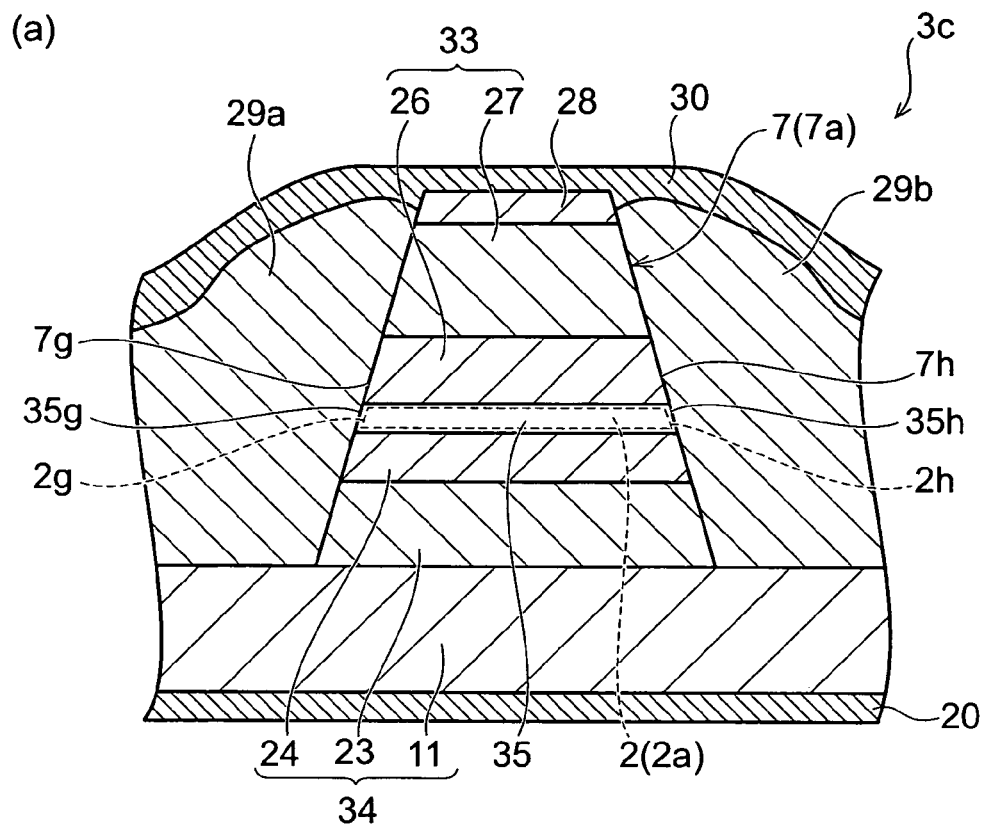
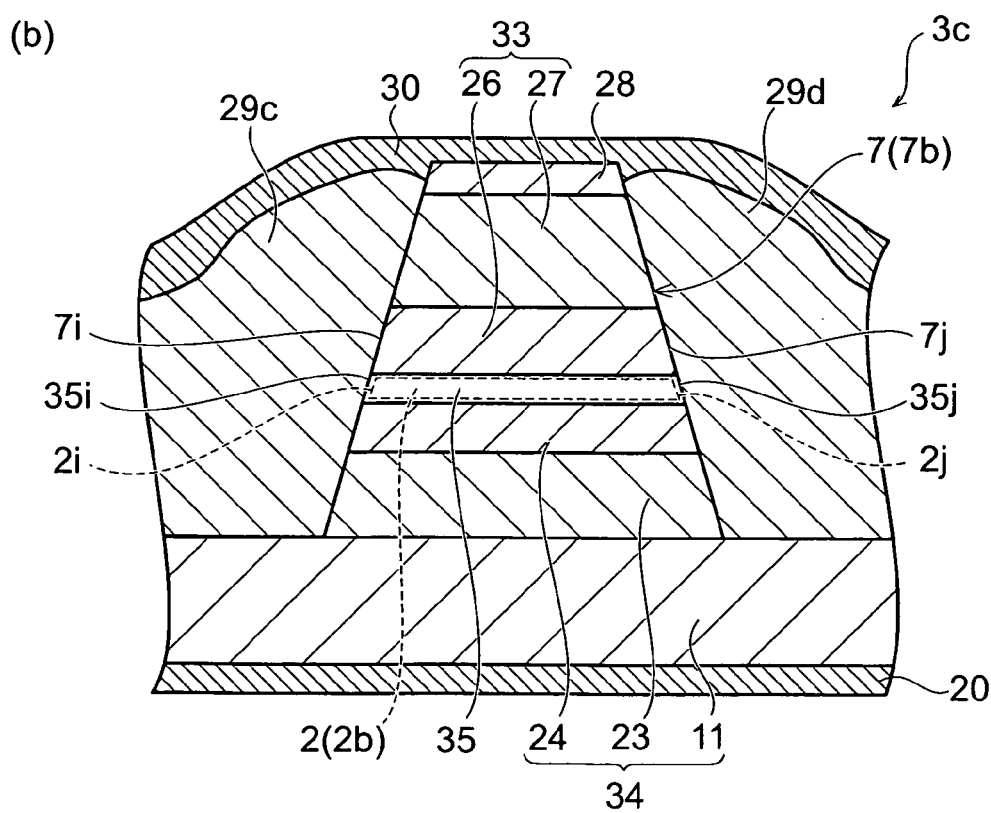

Fig.19
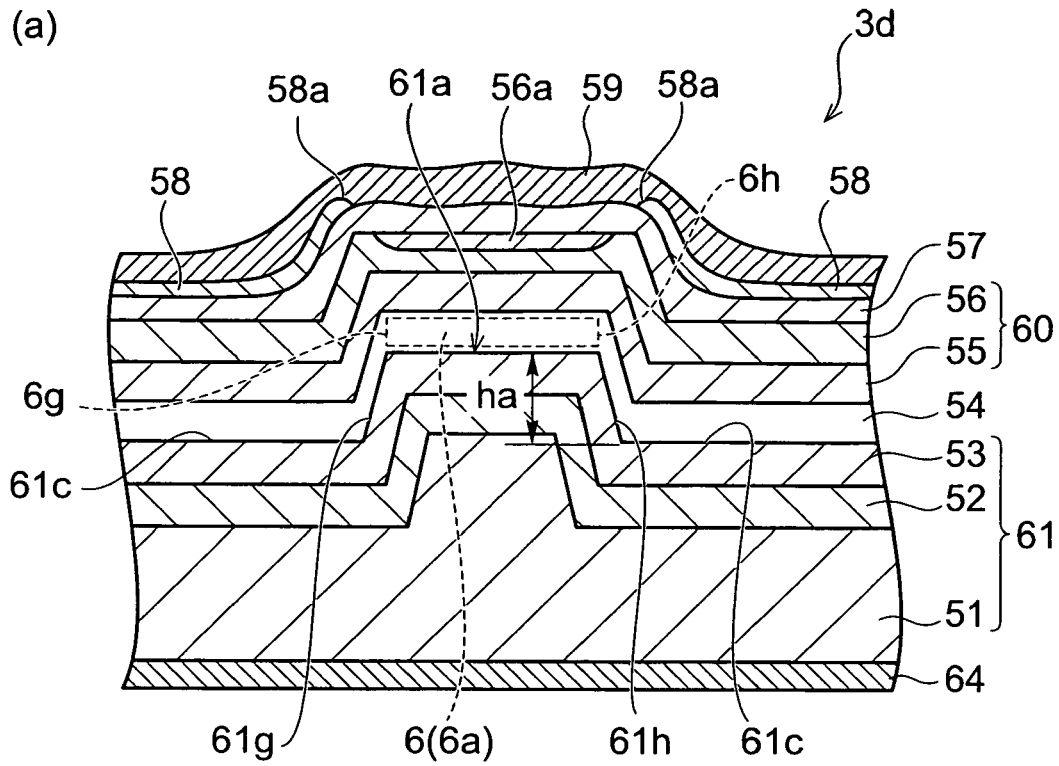
(a)
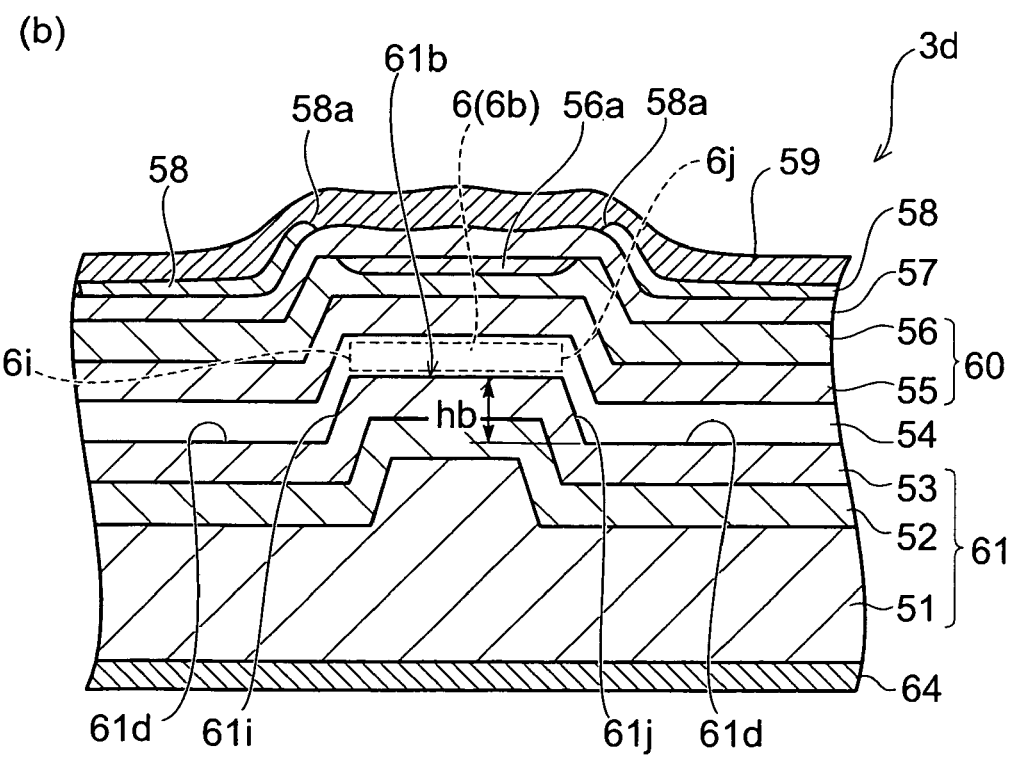
(b)

Fig.20
(a)
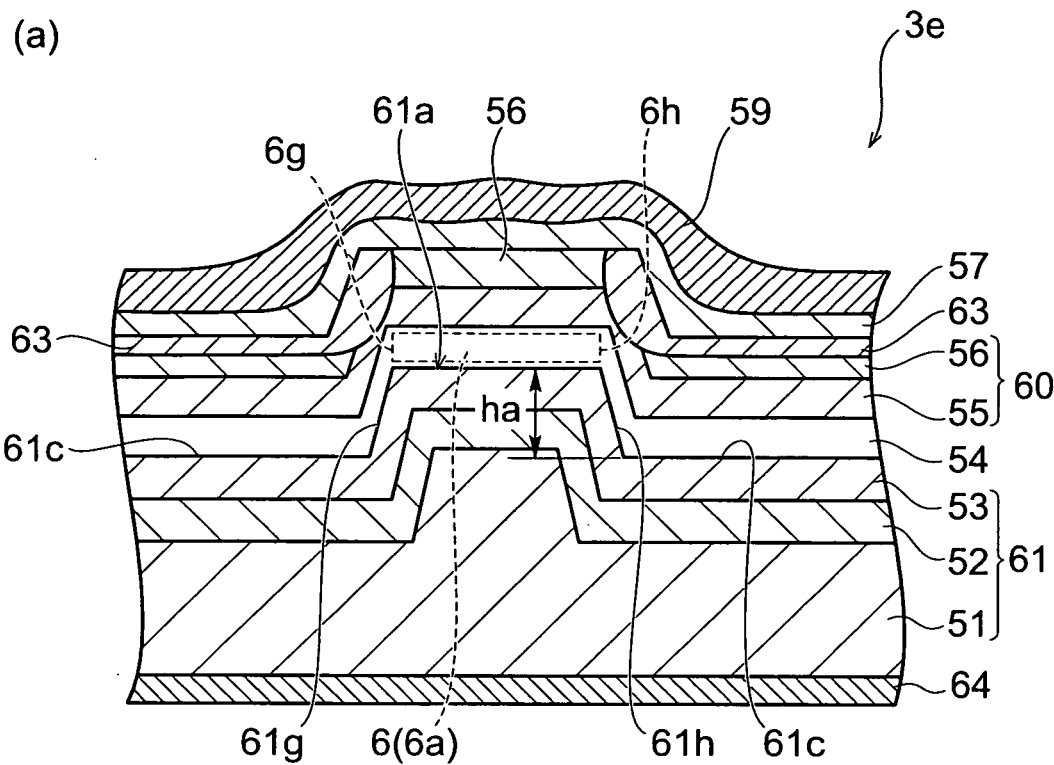
(b)
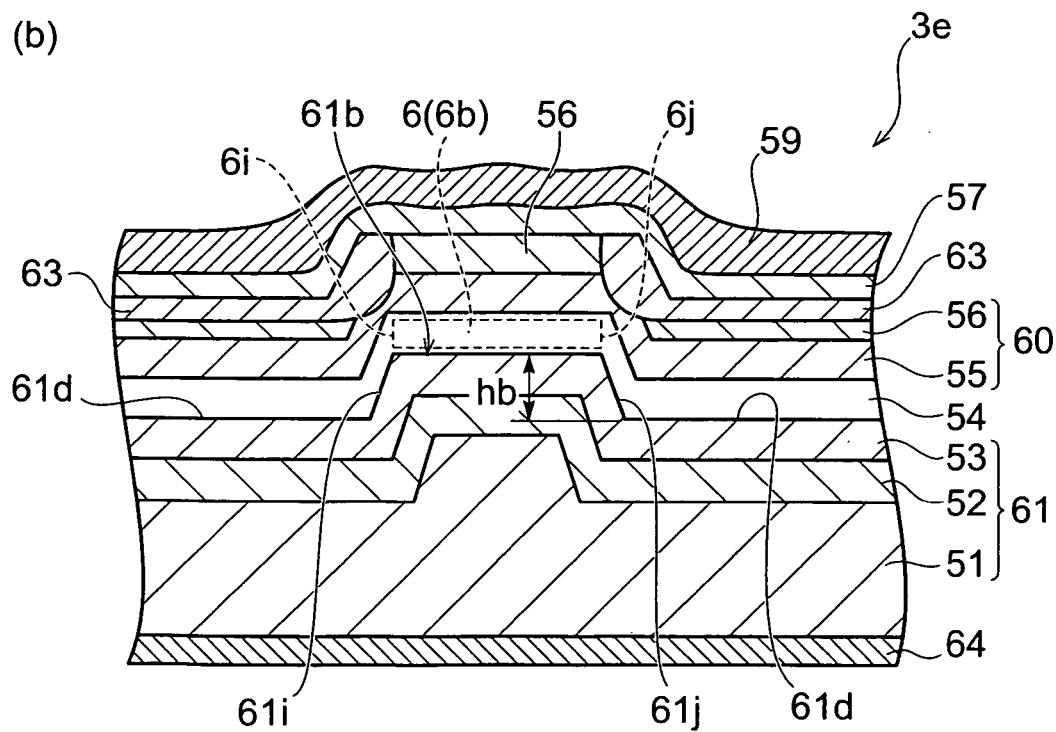

SEMICONDUCTOR LASER DEVICE AND SEMICONDUCTOR LASER ELEMENT ARRAY

TECHNICAL FIELD

The present invention relates to a semiconductor laser element and a semiconductor laser element array including the semiconductor laser element.

BACKGROUND ART

There have conventionally been known space transverse single-mode and multi-mode semiconductor laser elements. In single-mode semiconductor laser elements of the two types, the oscillation mode in a waveguide region is restricted to only a single mode to cause the waveguide region to be narrowed. However, the narrower the waveguide region, the smaller the area of the emitting end decreases. Also, an excessive laser beam density at the emitting end has an impact on, for example, the reliability of the semiconductor laser element. Therefore, single-mode semiconductor laser elements are suitable for applications that utilize relatively low-powered laser beams. It is noted that as an example of a single-mode semiconductor laser element, there can be cited, for example, a semiconductor laser device disclosed in Patent Document 1. The semiconductor laser device is a single-mode semiconductor laser and is designed to increase the intensity of laser beams by widening the waveguide region thereof.

On the other hand, in multi-mode semiconductor laser elements, multiple modes may be mixed in a waveguide region to allow the waveguide region to be widened. Therefore, the area of the emitting end can be increased, and laser beams with a relatively high intensity can be emitted. Such multi-mode semiconductor laser elements are suitable for applications that require relatively high-powered laser beams.

However, multi-mode semiconductor laser elements suffer from the following problem. That is, since multiple modes are mixed in a waveguide region, the emitted pattern of laser beams emitted from the emitting end is distorted to result in having a relatively large emitting angle. Therefore, the lens for collecting or collimating such laser beams has a complex shape, resulting in a possibility that no desired laser beam may be obtained and/or production cost may be increased (the lens may be expensive).

As a technique for solving the above-described problems with multi-mode semiconductor laser elements, there can be cited, for example, a resonator disclosed in Patent Document 2. FIG. 1 shows the structure of a conventional resonator, where the area (a) of FIG. 1 is a plan view showing the configuration of the resonator. The resonator 100 has two regions 102a and 102b in an active layer 101. Also, The area (b) of FIG. 1 shows a refractive index distribution at the cross-sections III-III and IV-IV in the area (a) of FIG. 1. As shown in the area (b) of FIG. 1, the refractive index $n_2$ in the regions 102a and 102b is smaller than the refractive index $n_1$ in the other regions in the active layer 101. Also, the regions 102a and 102b are formed in the active layer 101 at an angle where light L reflected perpendicularly at the emitting and reflecting ends 100a and 100b is totally reflected at the side surfaces of the regions 102a and 102b. Patent Document 2 employs such a configuration to limit the optical path of light L resonating in the active layer 101 and thereby to achieve a single-mode oscillation without restricting the width of the waveguide region.

It is noted that as a known technique related to the present invention other than Patent Documents 1 and 2, there is known a semiconductor laser described in Patent Document 3.

Patent Document 1: Japanese Patent Application Laid-Open No. 10-41582

Patent Document 2: International Patent Publication No. WO00/48277

Patent Document 3: Japanese Patent No. 2531719

DISCLOSURE OF THE INVENTION

Problem to be Solved by the Invention

The present inventors have examined the conventional semiconductor laser elements to consequently find the following problems. That is, when forming the regions 102a and 102b in the active layer 101 of the resonator disclosed in Patent Document 2, it is necessary to consider that the angle of the regions 102a and 102b includes an error. It is theoretically possible to achieve single-mode light precisely by aligning the angle of the regions 102a and 102b with the total reflection critical angle of the light L. However, when the angle of the regions 102a and 102b exceeds the total reflection critical angle of the light L if the angle of the regions 102a and 102b includes a production error, the light L transmits through the regions 102a and 102b. In this case, it is difficult to achieve laser oscillation. The total reflection critical angle at the regions 102a and 102b also varies depending on the temperature of the element. Therefore, it is actually necessary to set the angle of the regions 102a and 102b with a certain degree of margin with respect to the total reflection critical angle of the light L. This limits the reduction of the emitting angle of the light L.

The present invention has been made to solve the above-described problems, and an object thereof is to provide a semiconductor laser element capable of emitting laser beams having relatively high intensity and small emitting angle efficiently with a simpler structure, and a semiconductor laser element array including a plurality of semiconductor laser elements.

Means for Solving Problem

In order to solve the above-described problems, a semiconductor laser element according to the present invention comprises a first semiconductor portion including a first conductivity type semiconductor layer, a second semiconductor portion including a second conductivity type semiconductor layer, an active layer provided between the first semiconductor portion and the second semiconductor portion, a light emitting surface arranged on one end face of the active layer, a light reflecting surface arranged on the other end face of the active layer, and a waveguide region formed in the active layer for communicating between the light reflecting surface and the light emitting surface. The light emitting surface and light reflecting surface are arranged in such a manner that a first normal line that passes through the center of the light reflecting surface is substantially parallel with a second normal line that passes through the center of the light emitting surface. It is noted that the light emitting surface and light reflecting surface can employ parts of cleavage surfaces in the active layer that serve as resonating surfaces for laser beams, and the positional relationship between the normal lines of such cleavage surfaces facing each other is included in a substantially parallel state. For example, the light emitting surface and light reflecting surface may be arranged in a state where the first and second normal lines are aligned with each other (both of the normal lines are on one straight line) or in a state where the first and second normal lines are apart from each other by a predetermined distance.

Particularly, in the semiconductor laser element according to the present invention, the waveguide region includes, at least, first and second portions having respective different total reflection critical angles at the side surfaces thereof, and the first and second portions are arranged in positions where the relative angle of the side surfaces thereof to the light reflecting surface and the light emitting surface is greater than the total reflection critical angle at the side surfaces. Here, total reflection critical angle means the minimum angle (incident angle) between the normal line of a side surface defining a waveguide region and the incident direction of light arriving at the side surface at which the incident light is totally reflected at the side surface, the complementary angle of which is given by (90°—total reflection critical angle).

As described above, in the semiconductor laser element according to the present invention, the relative angle of the side surfaces defining the waveguide region to the light emitting surface and light reflecting surface is set based on the total reflection critical angle at the side surfaces. Since light incident on a side surface of the waveguide region at an incident angle smaller than the total reflection critical angle transmits through the side surface out of the waveguide region, the optical path of light resonating in the waveguide region is limited to that through which the light is incident on the side surface of the waveguide region at an incident angle equal to or greater than the total reflection critical angle and reflected approximately perpendicularly at the light emitting surface and light reflecting surface. That is, in accordance with the semiconductor laser element, since the structure of the waveguide region limits the optical path of laser beams for resonance, the angular component of light associated with laser oscillation in the waveguide region is restricted. This causes the phase of guided light to be aligned, resulting in a single-mode oscillation or close thereto. Therefore, in accordance with the semiconductor laser element, the width of the waveguide region cannot be restricted as in single-mode semiconductor laser elements, whereby the horizontal emitting angle of laser beams can be made narrower by widening the waveguide region, and it is possible to emit laser beams with a higher intensity.

Here, the relative angle of the side surfaces of the waveguide region to the light emitting surface and light reflecting surface and the total reflection critical angle at the side surfaces vary depending on production accuracy and/or temperature change. Thus, the relative angle is preferably set with some margin with respect to the total reflection critical angle on design. In this case, the angular component of light associated with laser oscillation is to be restricted within a certain angular range. In the semiconductor laser element, since the total reflection critical angle at, at least, one portion (first portion) among the side surfaces of the waveguide region is different from that at another portion (second portion), the angular component of propagating light is restricted within a mutually shifted angular range for each portion of the side surfaces defining the waveguide region. Since light resonating in the waveguide region is reflected at each portion of the side surfaces of the waveguide region, the angular component of light resonating in the waveguide region is to be restricted within a narrower angular range reflectable at all portions of the side surfaces. Therefore, in accordance with the semiconductor laser element, the emitting angle of laser beams can be made further narrower.

In the semiconductor laser element according to the present invention, the waveguide region may have a shape including a plurality of portions each defined by a pair of side surfaces. In this case, the total reflection critical angle at each side surface defining the plurality of portions is different from each other, and the plurality of portions are arranged in positions where the relative angle of the side surfaces thereof to the light emitting surface and the light reflecting surface is greater than the total reflection critical angle at the side surfaces. In this arrangement, each side surface defining the plurality of portions forms one portion of the side surfaces of the waveguide region.

Alternatively, in the semiconductor laser element according to the present invention, the total reflection critical angle at one of a pair of side surfaces defining, at least, a part of the waveguide region may be different from that at the other side surface. In this case, the waveguide region is arranged in such a manner that the relative angle of one side surface to the light emitting surface and the light reflecting surface is greater than the total reflection critical angle at the side surface, and that the relative angle of the other side surface to the light emitting surface and the light reflecting surface is greater than the total reflection critical angle at the other side surface. In this arrangement, each of the pair of side surfaces defining the part forms one portion of the side surfaces of the waveguide region. That is, with at least one of either the foregoing arrangements, it is possible to achieve a semiconductor laser element in which the emitting angle of laser beams can be made narrower.

In the semiconductor laser element according to the present invention, when the waveguide region includes the foregoing plurality of portions, the length of the plurality of portions and the spacing between the pair of side surfaces are preferably set in such a manner that light resonating in the waveguide region that is formed between the light emitting surface and the light reflecting surface is reflected at each of the pair of side surfaces by the same number of times. When the resonating light is thus reflected (totally) at each of the pair of side surfaces defining the waveguide region by the same number of times, the resonating light can be incident and reflected along the normal lines of both the light reflecting surface and light emitting surface. Also, since the resonating light is reflected totally at each of the pair of side surfaces defining the waveguide region at least one time, there is no optical path that connects the light emitting surface and light reflecting surface with a straight line in the waveguide region. Therefore, in accordance with the semiconductor laser element, it is possible to restrict the optical path of laser beams suitably in the waveguide region.

In the semiconductor laser element according to the present invention, if the waveguide region includes a plurality of portions, the waveguide region may further include one or more intermediate portions positioned, respectively, between the plurality of portions. The intermediate portions are arranged in such a manner that the side surfaces thereof are substantially parallel with the first and second normal lines. Also in accordance with this arrangement, when light propagating through the plurality of portions included in the waveguide region resonates, it is possible to reduce optical loss at the boundaries between the plurality of portions having their respective different side surface angles.

The waveguide region may be a refractive index type waveguide formed in the active layer. In this case, in the semiconductor laser element according to the present invention, the first semiconductor portion includes a ridge portion for generating a refractive index type waveguide region in the active layer and a thin portion adjacent to the ridge portion. It is noted that the total reflection critical angle at the side surfaces of the waveguide region is controlled by adjusting the thickness of the thin portion.

That is, when a current is applied to the ridge portion in the first semiconductor portion, the area in the active layer that corresponds to the ridge portion becomes an active region. In this case, an effective refractive index difference occurs between either side of the active region, and therefore there is generated a refractive index type waveguide region having a shape along that of the ridge portion when viewed from above (when viewed in the thickness direction of the first semiconductor portion). In addition, the total reflection critical angle at a certain portion of the side surfaces of the waveguide region is set arbitrarily by adjusting the thickness of the thin portion corresponding to the portion of the side surfaces of the waveguide region. Therefore, employing such a structure makes it possible to form a waveguide region easily in the active layer, in which the total reflection critical angle at, at least, one portion among the side surfaces is different from that at another portion.

Also, the semiconductor laser element, in which the first semiconductor portion thus has the ridge portion for generating the refractive index type waveguide region in the active layer, preferably further includes current blocking portions for applying a current to the ridge portion. The current blocking portions are provided along the side surfaces of the ridge portion, and the total reflection critical angle at the side surfaces of the waveguide region is controlled by adjusting the material composition of the current blocking portions.

In the arrangement above in which the current blocking portions are thus provided, when a current constricted by the current blocking portions is applied to the ridge portion in the first semiconductor portion, the area in the active layer that corresponds to the ridge portion becomes an active region. In this case, an effective refractive index difference occurs between the boundaries of the active region, and therefore there is generated a refractive index type waveguide region having a shape along that of the ridge portion when viewed from above. In addition, the total reflection critical angle at a certain portion of the side surfaces of the waveguide region is set arbitrarily by adjusting the material composition of the current blocking portions corresponding to the portion of the side surfaces of the waveguide region. Therefore, employing such a structure also makes it possible to form a waveguide region easily in the active layer, in which the total reflection critical angle at, at least, one portion among the side surfaces is different from that at another portion.

It is noted that the ridge portion for generating the waveguide region in the active layer may be provided in the second semiconductor portion. In this case, the active layer and the first semiconductor portion are laminated on the second semiconductor portion including the ridge portion. In particular, in this arrangement, the semiconductor laser element preferably further includes current concentrating means provided on the active layer to apply a current to a part of the active layer that is positioned above the ridge portion. In this case, the total reflection critical angle at the side surfaces of the waveguide region is controlled by adjusting the height of side surfaces of the ridge portion.

In the arrangement above in which the current concentrating means is further provided, when a current is applied to the part of the active layer that is positioned above the ridge portion by the current concentrating means, the current applied area (the part of the active layer that is positioned above the ridge portion) becomes an active region. In this case, a refractive index difference occurs between either side of the current applied area, and therefore there is generated a waveguide region having a shape along that of the ridge portion when viewed from above. In addition, the total reflection critical angle at a certain portion of the side surfaces of the waveguide region is set arbitrarily by adjusting the height of side surfaces of the ridge portion corresponding to the portion of the side surfaces of the waveguide region. Therefore, employing such a structure makes it possible to form a waveguide region easily, in which the total reflection critical angle at, at least, one portion among the side surfaces is different from that at another portion.

In the semiconductor laser element according to the present invention, the waveguide region is not restricted to such a refractive index type one. That is, the active layer may have sidewalls for defining the side surfaces of the waveguide region. In this case, current blocking portions for applying a current to the active layer are provided along the sidewalls of the active layer, and the total reflection critical angle at the side surfaces of the waveguide region is controlled by adjusting the refractive index difference between the active layer and the current blocking portions in the sidewalls of the active layer.

In the arrangement above in which the waveguide region is defined by the sidewalls of the active layer, when a current constricted by the current blocking portions is applied to the active layer, the entire active layer becomes an active region. In this case, there is a refractive index difference between either side of the active region, that is, between the active layer and the current blocking portions in the sidewalls of the active layer, and therefore there is generated a waveguide region having a shape along that of the active layer when viewed from above. In addition, the total reflection critical angle at a certain portion of the side surfaces of the waveguide region is set arbitrarily by adjusting the refractive index difference between the active layer and the current blocking portions in the sidewalls of the active layer corresponding to the portion of the side surfaces of the waveguide region. Therefore, employing such a structure makes it possible to form a waveguide region easily, in which the total reflection critical angle at, at least, one portion among the side surfaces is different from that at another portion.

A semiconductor laser element array according to the present invention includes a plurality of semiconductor laser elements each having the same structure as the semiconductor laser element (according to the present invention) that has one of such structures as mentioned above. Also, the plurality of semiconductor laser elements are formed integrally so as to be arranged in the direction intersecting with the first and second normal lines. In accordance with the thus arranged semiconductor laser element array, the plurality of semiconductor laser elements each having one of such structures as mentioned above allow laser beams with a high intensity to be emitted, and the horizontal emitting angle of laser beams can be made narrower.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

EFFECT OF THE INVENTION

In accordance with the semiconductor laser element and semiconductor laser element array according to the present invention, laser beams with a relatively high intensity can be emitted, and the emitting angle of laser beams can be made narrower.

BRIEF DESCRIPTION OF THE DRAWINGS

FIG. 1 shows the configuration of a conventional resonator;

FIG. 3 shows enlarged cross-sectional views of the cross-sections I-I and II-II of the semiconductor laser element array shown in FIG. 2;

FIG. 4 shows tables of examples of material combinations and material compositions for each layer to be laminated on a substrate;

FIG. 9 shows graphs of correlations between the angular component of a laser beam and the reflectivity at the side surface in a first portion;

FIG. 16 shows cross-sectional views of the configuration of a second embodiment of a semiconductor laser element according to the present invention;

FIG. 17 shows cross-sectional views of the configuration of a third embodiment of a semiconductor laser element according to the present invention;

FIG. 19 shows enlarged cross-sectional views of the cross-sections V-V and VI-VI of the semiconductor laser element according to the fourth embodiment shown in FIG. 18;

FIG. 20 shows cross-sectional views of the configuration of a modification of the semiconductor laser element according to the fourth embodiment;

DESCRIPTION OF THE REFERENCE NUMERALS

Figure 2:
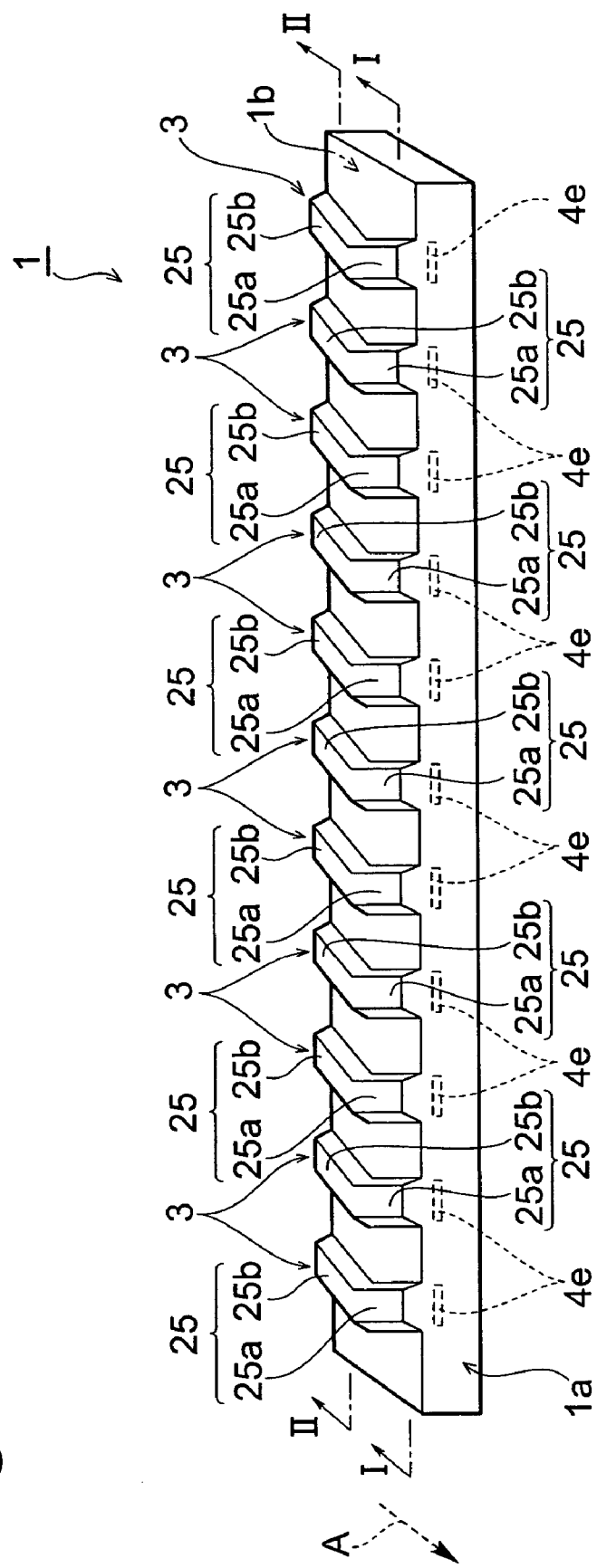
FIG. 2 is a schematic perspective view showing the configuration of a semiconductor laser element array (an embodiment of a semiconductor laser array) to which a first embodiment of a semiconductor laser element according to the present invention is applied.

1 . . . semiconductor laser element array; 1a light emitting surface; 1b . . . light reflecting surface; 4 . . . waveguide region; 3, 3a-3f . . . semiconductor laser elements; 4e . . . laser beam emitting end; 4f . . . laser beam reflecting end; 4a, 9a, 25a . . . first portions; 4b, 9b, 25b . . . second portions; 4g-4j, 9g-9j . . . side surfaces; 8 . . . laminated body; 9 . . . ridge portion; 9e, 9f . . . end faces; 10a, 10b . . . thin portions; 11 . . . substrate; 12 . . . n-type cladding layer; 13 . . . second optical guiding layer; 14 . . . active layer; 15 . . . first optical guiding layer; 16 . . . p-type cladding layer; 17 . . . p-type cap layer; 18 . . . insulating layer; 18a . . . opening portion; 19 . . . p-side electrode layer; 20 . . . n-side electrode layer; 25 . . . convex portion; 31 . . . first semiconductor portion; and 32 . . . second semiconductor portion.

BEST MODES FOR CARRYING OUT THE INVENTION

Embodiments of semiconductor laser elements and semiconductor laser element arrays according to the present invention will hereinafter be explained in detail with reference to FIG. 2 to FIG. 24. It is noted that in the descriptions of the drawings, identical components are designated by the same reference numerals to omit redundant description.

First Embodiment

FIG. 2 is a schematic perspective view showing the configuration of a semiconductor laser element array (according to an embodiment of the present invention) to which a first embodiment of a semiconductor laser element according to the present invention is applied. It is noted that semiconductor laser elements according to second to fifth embodiments to be described hereinafter can also be applied to the semiconductor laser element array having such a structure as shown in FIG. 2. In FIG. 2, the semiconductor laser element array 1 includes a plurality of semiconductor laser elements 3 that are formed integrally. The number of semiconductor laser elements 3 constituting the semiconductor laser element array 1 is optional, where including only one element means not an array but a stand-alone. The semiconductor laser element array 1 is provided alongside in the direction of a predetermined axis A and has a light emitting surface 1a and a light reflecting surface 1b that are opposed to each other (the normal lines at the center of the light emitting surface 1a and light reflecting surface 1b are aligned with the axis A). On the light emitting surface 1a, laser beam emitting ends 4e of the respective plurality of semiconductor laser elements 3 are arranged in a horizontal line. Laser beams are to be emitted from the laser beam emitting ends 4e in the direction of the predetermined axis A.

The plurality of semiconductor laser elements 3 each have a ridge-shaped convex portion 25. The convex portion 25 consists of a first portion 25a and a second portion 25b. One end of the first portion 25a reaches the light emitting surface 1a, while the other end of the first portion 25a is connected with one end of the second portion 25b. The other end of the second portion 25b reaches the light reflecting surface 1b. The first and second portions 25a and 25b are provided in such a manner that the longitudinal direction thereof is slanted off the light emitting surface 1a and light reflecting surface 1b. Also, the first and second portions 25a and 25b are connected with each other in such a manner that the longitudinal direction thereof intersects with each other. In each semiconductor laser element 3, there is generated a refractive index type waveguide region correspondingly to each convex portion 25. The laser beam emitting ends 4e are end faces of these waveguide regions on the light emitting surface 1a side. The plurality of integrally formed semiconductor laser elements 3 are arranged in line in the direction intersecting with that of the predetermined axis A.

FIG. 3 shows views of the cross-sectional structure of the semiconductor laser element array shown in FIG. 2. The area (a) of FIG. 3 is an enlarged cross-sectional view of the cross-section I-I in FIG. 2 focusing on one semiconductor laser element, and the area (b) of FIG. 3 is an enlarged cross-sectional view of the cross-section II-II in FIG. 2 focusing on one semiconductor laser element. Each semiconductor laser element 3 constituting the semiconductor laser element array 1 includes a substrate 11. Each semiconductor laser element 3 further includes: an n-type cladding layer 12 as a second conductivity type semiconductor layer; a second optical guiding layer 13; an active layer 14 having a quantum well structure; a first optical guiding layer 15; and a p-type cladding layer 16 as a first conductivity type semiconductor layer. The n-type cladding layer 12, second optical guiding layer 13, active layer 14, first optical guiding layer 15, and p-type cladding layer 16 are laminated on the substrate 11 in this order. Among these layers, the p-type cladding layer 16 and first optical guiding layer 15 form a first semiconductor portion 31, while the substrate 11, n-type cladding layer 12, and second optical guiding layer 13 form a second semiconductor portion 32. The first semiconductor portion 31 is provided with a ridge portion 9. On the outside of the ridge portion 9, there is provided a p-type cap layer 17 to be connected electrically with the p-type cladding layer 16. The ridge portion 9 has a first portion 9a provided on the light emitting surface 1a side of the substrate 11 and a second portion 9b provided on the light reflecting surface 1b side of the substrate 11. The first portion 25a of the convex portion 25 is composed of the first portion 9a of the ridge portion 9 and the p-type cap layer 17. The second portion 25b of the convex portion 25 is composed of the second portion 9b of the ridge portion 9 and the p-type cap layer 17.

On either side of the first portion 9a of the ridge portion 9, there are formed thin portions 10a adjacent to the both side surfaces of the first portion 9a. The thin portions 10a are relatively thin portions formed by etching the first semiconductor portion 31 and provided on the light emitting surface 1a side of the substrate 11. Similarly, on either side of the second portion 9b of the ridge portion 9, there are formed thin portions 10b adjacent to the both side surfaces of the second portion 9b. The thin portions 10b are relatively thin portions formed by etching the first semiconductor portion 31 and provided on the light reflecting surface 1b side of the substrate 11. In the present embodiment, the thickness $t_b$ of the thin portions 10b is made greater than the thickness $t_a$ of the thin portions 10a.

On the further outside of the p-type cap layer 17, there is provided a p-side electrode layer 19 for applying a current from outside. Between the p-type cap layer 17 and the p-side electrode layer 19 is provided an insulating layer 18, the insulating layer 18 having an opening portion 18a in the upper part of the convex portion 25. Since the p-side electrode layer 19 is in electrical contact with only the p-type cap layer 17 through the opening portion 18a, the current application from outside is limited to the p-type cap layer 17. Also, an n-side electrode layer 20 is formed on the surface of the substrate 11 opposite side to each semiconductor layer.

It is noted that n-GaAs is used, for example, as the semiconductor material of the substrate 11. Also, the combinations 1 to 3 shown in the area (a) of FIG. 4 are suitable, for example, as the material of each layer laminated on the substrate 11. Further, the composition shown in the area (b) of FIG. 4 can be cited, for example, as the specific material composition of each layer laminated on the substrate 11. The table in the area (b) of FIG. 4 also includes a suitable thickness of each layer.

The p-type cap layer 17 is made of, for example, p-GaAs. The p-side electrode layer 19 is made of, for example, Ti/Pt/Au. The n-side electrode layer 20 is made of, for example, AuGe/Au. The insulating layer 18 is made of, for example, at least one among SiN, $SiO_2$, and $Al_2O_3$.

When a current is applied to the p-type cap layer 17, a part of the active layer 14 corresponding to the first and second portions 25a and 25b of the convex portion 25 (i.e. the area corresponding to the ridge portion 9) becomes an active region. In this case, an effective refractive index difference occurs in the active layer 14 and therefore there is generated a refractive index type waveguide region 4 (4a) in the active layer 14 correspondingly to the first portion 9a of the ridge portion 9, while there is generated a refractive index type waveguide region 4 (4b) in the active layer 14 correspondingly to the second portion 9b of the ridge portion 9.

Figure 5:
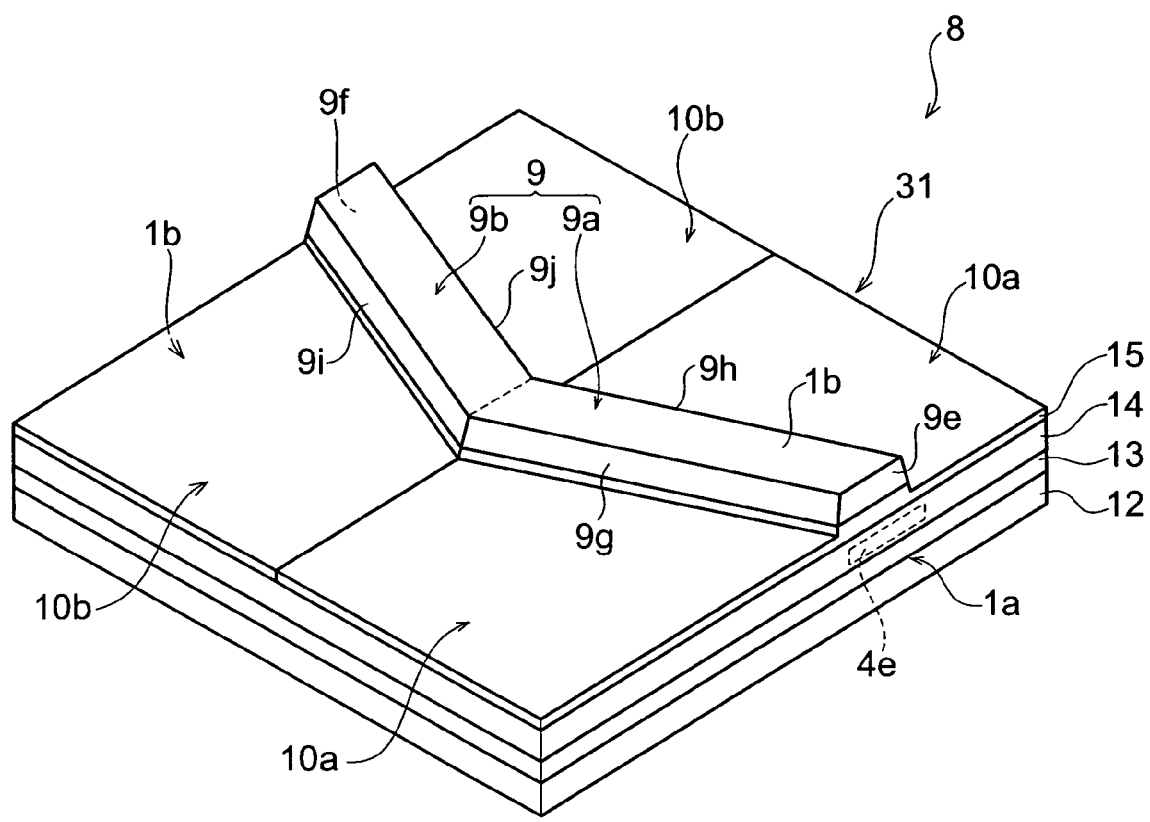
FIG. 5 is a perspective view showing a laminated body including a first semiconductor portion.
Figure 6:
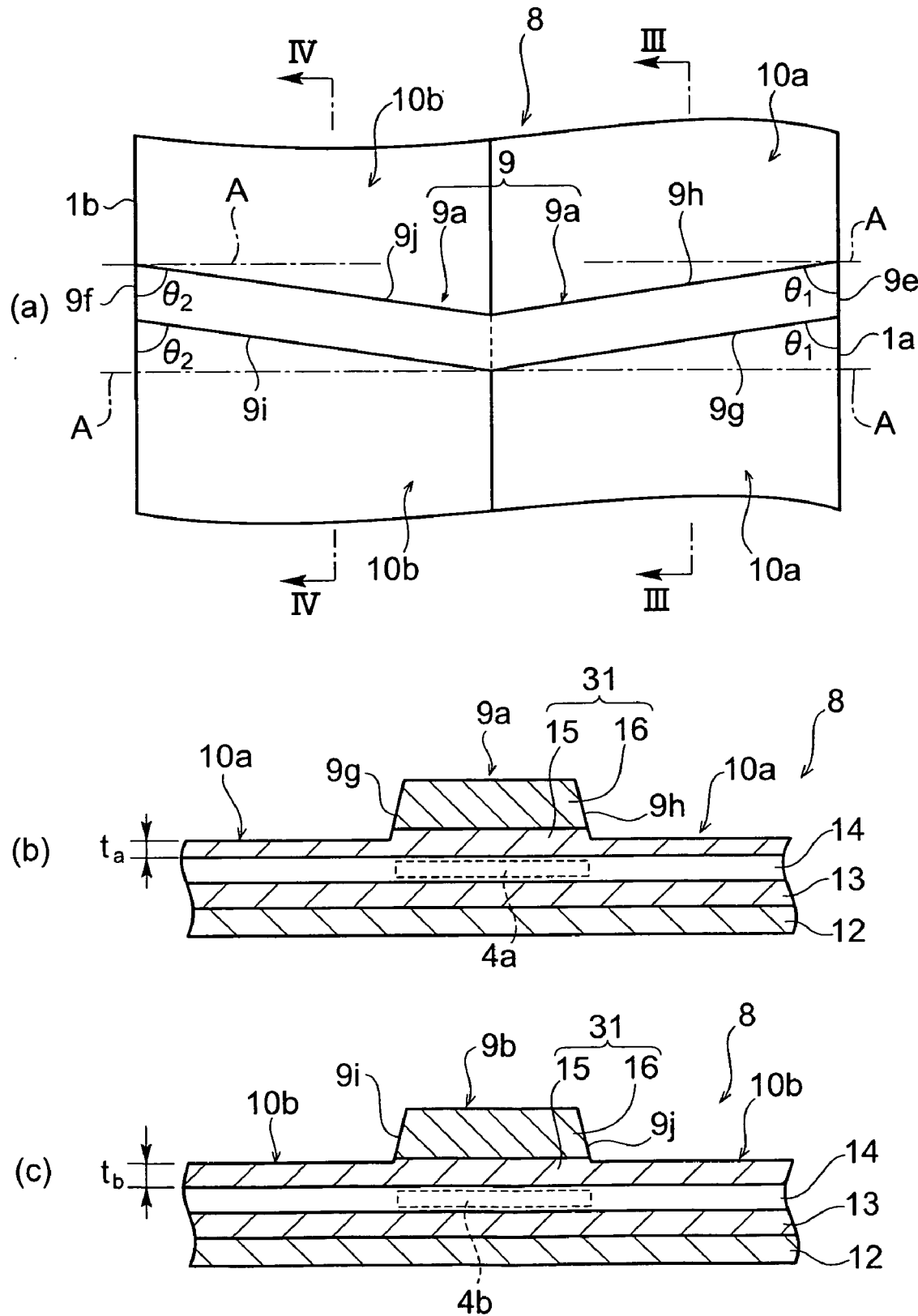
FIG. 6 shows a plan view and cross-sectional views of the laminated body shown in FIG. 5.

The first semiconductor portion 31 will here be explained with reference to FIGS. 5 and 6. It is noted that FIG. 5 is a perspective view showing the configuration of a laminated body 8 including the first semiconductor portion 31. The area (a) of FIG. 6 is a plan view of the laminated body 8, the area (b) of FIG. 6 shows the cross-section III-III of the laminated body 8 shown in the area (a) of FIG. 6, and the area (c) of FIG. 6 shows the cross-section IV-IV of the laminated body 8 shown in the area (a) of FIG. 6. The laminated body 8 is composed of the n-type cladding layer 12, second optical guiding layer 13, active layer 14, first optical guiding layer 15, and p-type cladding layer 16.

The convex ridge portion 9 is provided on the first semiconductor portion 31 across the light emitting surface 1a and light reflecting surface 1b. The ridge portion 9 consists of the first and second portions 9a and 9b. One end of the first portion 9a of the ridge portion 9 reaches the light emitting surface 1a, while the other end of the first portion 9a is connected with one end of the second portion 9b. The other end of the second portion 9b reaches the light reflecting surface 1b. Also, the first semiconductor portion 31 has the thin portions 10a along the first portion 9a of the ridge portion 9 and the thin portions 10b along the second portion 9b of the ridge portion 9. As mentioned above, the thin portions 10a and 10b are formed by etching the first semiconductor portion 31. Then, the thickness $t_b$ of the thin portions 10b is made greater than the thickness $t_a$ of the thin portions 10a by adjusting the etching time.

The first portion 9a of the ridge portion 9 has an end face 9e and a pair of side surfaces 9g and 9h that are opposed to each other. The pair of side surfaces 9g and 9h defines the area of the first portion 9a of the ridge portion 9, serving as boundaries between the first portion 9a and the thin portions 10a. The end face 9e is on the light emitting surface 1a. The side surface 9g extends from one end of the end face 9e through the second portion 9b of the ridge portion 9, and the side surface 9h extends from the other end of the end face 9e through the second portion 9b of the ridge portion 9. The side surfaces 9g and 9h are provided to have a relative angle of θ₁ to the light emitting surface 1a and light reflecting surface 1b when viewed from above in the thickness direction.

The second portion 9b of the ridge portion 9 has an end face 9f and a pair of side surfaces 9i and 9j that are opposed to each other. The pair of side surfaces 9i and 9j defines the area of the second portion 9b of the ridge portion 9, serving as boundaries between the second portion 9b and the thin portions 10b. The end face 9f is on the light reflecting surface 1b. The side surface 9i extends from one end of the end face 9f through the side surface 9g of the first portion 9a, and the side surface 9j extends from the other end of the end face 9f through the side surface 9h of the second portion 9b. The side surfaces 9i and 9j are provided to have a relative angle of θ₂ (≠ θ₁) to the light emitting surface 1a and light reflecting surface 1b when viewed from above in the thickness direction.

Figure 7:
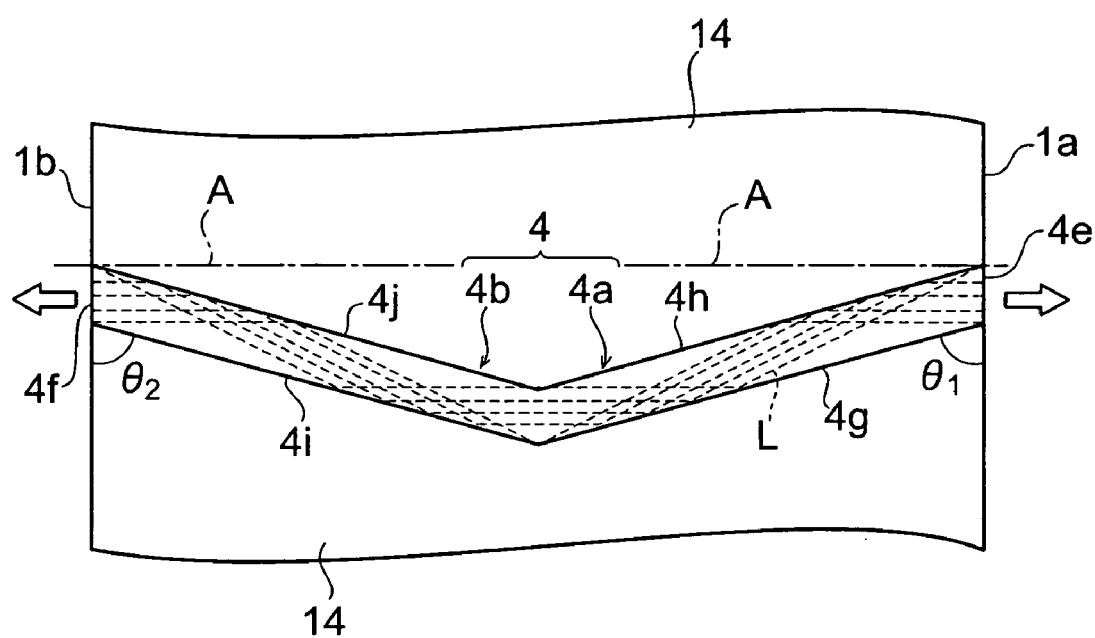
FIG. 7 is a plan view showing a waveguide region formed in an active layer.

In the active layer 14, there is generated a waveguide region 4 correspondingly to the shape of the ridge portion 9. Here, FIG. 7 is a plan view showing the waveguide region 4 formed in the active layer 14. The waveguide region 4 is a refractive index type one formed by the effective refractive index distribution in the active layer 14 due to current application to the ridge portion 9. In the present embodiment, first and second portions 4a and 4b of the waveguide region 4 are generated in the active layer 14 correspondingly to the respective first and second portions 9a and 9b of the ridge portion 9. In the first portion 4a of the waveguide region 4, a laser beam emitting end 4e is generated correspondingly to the end face 9e of the ridge portion 9. Also, in the first portion 4a of the waveguide region 4, a pair of side surfaces 4g and 4h serving as part of the side surfaces of the waveguide region 4 are generated correspondingly to the respective side surfaces 9g and 9h of the ridge portion 9. In the second portion 4b of the waveguide region 4, a laser beam reflecting end 4f is generated correspondingly to the end face 9f of the ridge portion 9. Also, in the second portion 4b of the waveguide region 4, a pair of side surfaces 4i and 4j serving as the other part of the side surfaces of the waveguide region 4 are generated correspondingly to the respective side surfaces 9i and 9j of the ridge portion 9. The laser beam emitting end 4e and laser beam reflecting end 4f are parts of cleavage surfaces in the active layer 14 that serve as resonating surfaces for laser beams L. Also, the side surfaces 4g to 4j are generated by the refractive index difference between inside and outside of the waveguide region 4 and may have a constant thickness if the refractive index varies continuously. The side surfaces 4g to 4j function as reflecting surfaces for selectively transmitting or reflecting laser beams L generated in the waveguide region 4 depending on the incident angle onto the respective side surfaces.

The relative angle θ₁ between the side surfaces 4g and 4h in the first portion 4a of the waveguide region 4 and the light emitting surface 1a and light reflecting surface 1b (i.e. the relative angle θ₁ between the side surfaces 9g and 9h in the first portion 9a of the ridge portion 9 and the light emitting surface 1a and light reflecting surface 1b) is decided based on the total reflection critical angle θ_{ca} at the side surfaces 4g and 4h in the first portion 4a of the waveguide region 4. Here, total reflection critical angle at the side surfaces of the waveguide region 4 means that defined by the effective refractive index difference between inside and outside of the waveguide region 4 as a refractive index type waveguide region. Also, the total reflection critical angle θ_{ca} depends on the thickness t_a of the thin portions 10a in the first semiconductor portion 31. Since the relative angle θ₁ is decided based on the total reflection critical angle θ_{ca}, the pair of side surfaces 4g and 4h in the first portion 4a of the waveguide region 4 are adapted to totally reflect laser beams L incident from the light emitting surface 1a side or the light reflecting surface 1b side along the direction of the predetermined axis A.

In addition, the relative angle β2 between the side surfaces 4i and 4j in the second portion 4b of the waveguide region 4 and the light emitting surface 1a and light reflecting surface 1b (i.e. the relative angle θ₂ between the side surfaces 9i and 9j in the second portion 9b of the ridge portion 9 and the light emitting surface 1a and light reflecting surface 1b) is decided based on the total reflection critical angle θ_{cb} at the side surfaces 4i and 4j in the second portion 4b of the waveguide region 4. Here, although the total reflection critical angle θ_{cb} depends on the thickness t_b of the thin portions 10b in the first semiconductor portion 31, since the thickness t_a of the thin portions 10a and the thickness t_b of the thin portions 10b are different from each other, the total reflection critical angle θ_{cb} at the side surfaces 4i and 4j is different from the total reflection critical angle θ_{ca} at the side surfaces 4g and 4h. Since the relative angle θ₂ is decided based on the total reflection critical angle θ_{cb}, the pair of side surfaces 4i and 4j in the second portion 4b of the waveguide region 4 are adapted to totally reflect laser beams L incident from the light emitting surface 1a side or the light reflecting surface 1b side along the direction of the predetermined axis A.

As shown in FIG. 7, laser beams L reflected approximately perpendicularly at the laser beam reflecting end 4f along the direction of the predetermined axis A are incident on the side surface 4j in the second portion 4b at an angle of θ₂ and then reflected totally thereat. Then, the laser beams L are incident on the side surface 4i at an angle of θ₂ and then reflected totally thereat. The laser beams L reflected at the side surface 4i are incident on the side surface 4g in the first portion 4a at an angle of θ₁ and then reflected totally thereat. Then, the laser beams L are incident on the side surface 4h at an angle of θ₁ and then reflected totally thereat. Thus, the laser beams L reflected totally at the side surfaces 4g to 4j travel along the direction of the predetermined axis A to reach the laser beam emitting end 4e. A part of the laser beams L reaching the laser beam emitting end 4e transmits through the laser beam emitting end 4e to be emitted outward. The other part of the laser beams L is reflected approximately perpendicularly at the laser beam emitting end 4e along the direction of the predetermined axis A, and then reflected totally at the side surfaces 4g to 4j again to be returned to the laser beam reflecting end 4f. Thus, the laser beams L in the waveguide region 4 travel back and forth between the laser beam emitting end 4e and laser beam reflecting end 4f to result in resonance.

It is noted that the length of the first portion 4a of the waveguide region 4 and the spacing between the side surfaces 4g and 4h are set in such a manner that a laser beam L resonating between the laser beam emitting end 4e and laser beam reflecting end 4f is reflected at each of the pair of side surfaces 4g and 4h in the first portion 4a by the same number of times. Similarly, the length of the second portion 4b of the waveguide region 4 and the spacing between the side surfaces 4i and 4j are set in such a manner that a laser beam L resonating between the laser beam emitting end 4e and laser beam reflecting end 4f is reflected at each of the pair of side surfaces 4i and 4j in the second portion 4b by the same number of times.

Figure 8:
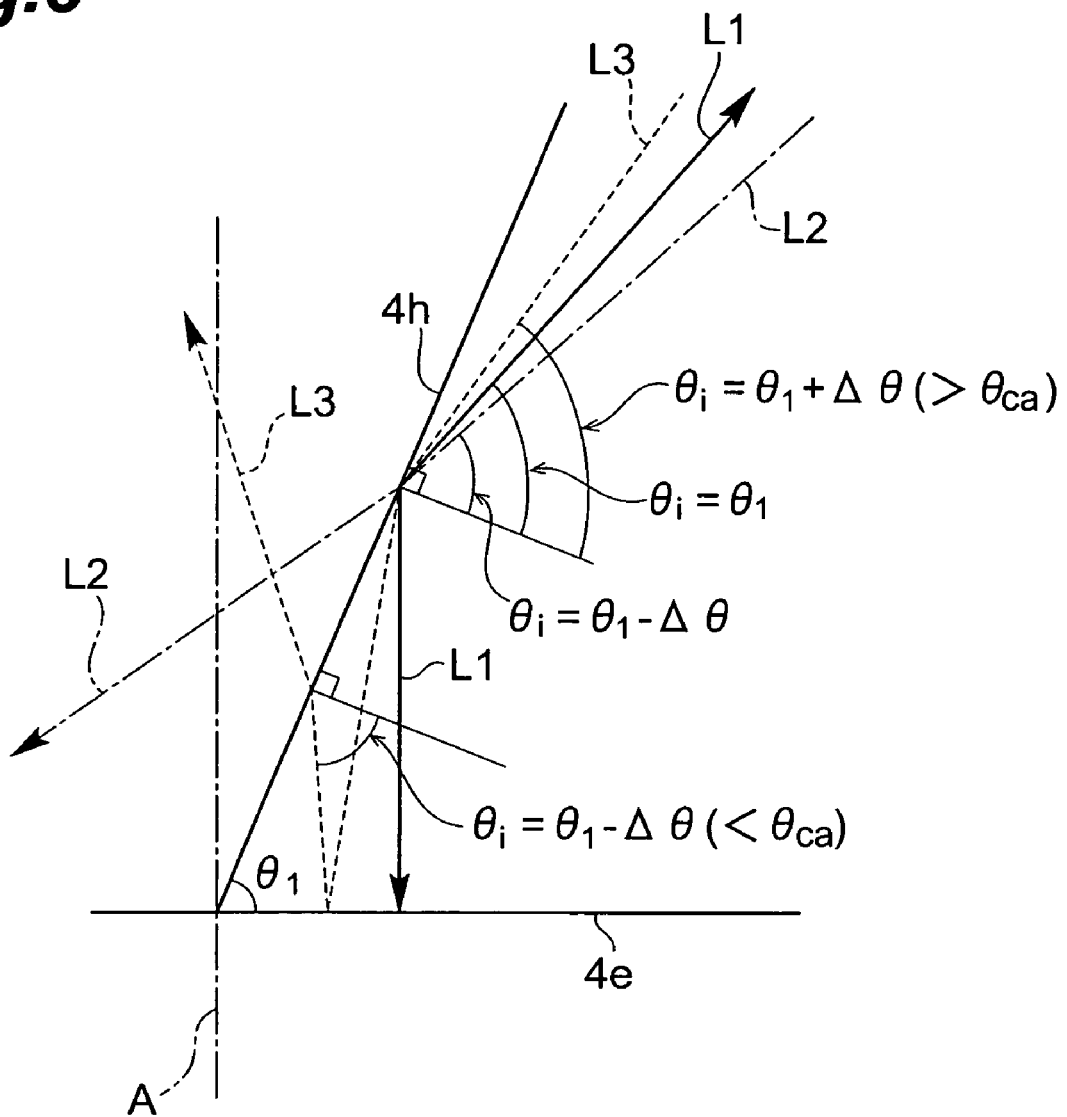
FIG. 8 is a view for explaining laser beams incident on a side surface of the waveguide region at various incident angles.

Here will be explained a mechanism by which laser beams L are limited to the above-described optical paths. FIG. 8 is a view for explaining laser beams L1 to L3 incident on the side surface 4h at various incident angles θ₁. It is noted that in FIG. 8, the same effect can be achieved even if the side surface 4h may be replaced with the side surface 4g. The same effect can also be achieved even if the side surface 4h, laser beam emitting end 4e, and angle $\theta_1$ may be replaced, respectively, with the side surface 4i or 4j, laser beam reflecting end 4f, and angle $\theta_2$.

Referring to FIG. 8, a laser beam L1 incident on the side surface 4h at an incident angle of $\theta_i$ that is equal to the angle $\theta_1$ (>$\theta_{ca}$) is reflected totally at the side surface 4h and incident on the laser beam emitting end 4e perpendicularly along the direction of the predetermined axis A. Then, the laser beam L1 is reflected at the laser beam emitting end 4e to subsequently be returned through the same optical path. Therefore, the laser beam L1 will resonate on the same optical path.

On the other hand, a laser beam L2 incident on the side surface 4h at an incident angle of $\theta_i=\theta_1-\Delta\theta$ that is smaller than the angle $\theta_1$ will transmit through the side surface 4h, if ($\theta_1-\Delta\theta$) is smaller than the total reflection critical angle $\theta_{ca}$, to cause no resonance. Also, a laser beam L3 incident on the side surface 4h at an incident angle of $\theta_i=\theta_1+\Delta\theta$ that is greater than the angle $\theta_1$ is reflected totally at the side surface 4h because the incident angle $\theta_i$ is greater than the total reflection critical angle $\theta_{ca}$, but after being reflected at the laser beam emitting end 4e, the incident angle $\theta_i$ when incident on the side surface 4h again is represented by $\theta_i=\theta_1-\Delta\theta$. If ($\theta_1-\Delta\theta$) is smaller than the total reflection critical angle $\theta_{ca}$, the laser beam L3 will also transmit through the side surface 4h finally to cause no resonance. Thus, at the side surface 4h (or 4g), only a laser beam L incident on the side surface 4h (4g) at an incident angle of $\theta_i$ ($\theta_1+\Delta\theta\geq\theta_i\geq\theta_1-\Delta\theta$) when $\Delta\theta$ satisfies $\theta_1-\Delta\theta\geq\theta_{ca}$ will selectively result in resonance. Similarly, at the side surface 4i or 4j, only a laser beam L incident on the side surface 4i or 4j at an incident angle of $\theta_i$ ($\theta_2+\Delta\theta\geq\theta_i\geq\theta_2-\Delta\theta$) when $\Delta\theta$ satisfies $\theta_2-\Delta\theta\geq\theta_{cb}$ will selectively result in resonance.

Here, the area (a) of FIG. 9 is a graph showing a correlation between the angular component of a laser beam L and the reflectivity at the side surfaces 4g and 4h in the first portion 4a. It is noted that in the area (a) of FIG. 9, $\theta_{ca1}$ is the lower limit of $\theta_i$, corresponding to $\theta_{ca}$. Also, $\theta_{ca2}$ is the upper limit of $\theta_i$, corresponding to $\theta_1+(\theta_1-\theta_{ca})$. Further, the following effects based on the area (a) of FIG. 9 are the same for the second portion 4b.

Referring to the area (a) of FIG. 9, it is found that the reflectivity at the side surfaces 4g and 4h is 1, that is, the laser beam L is reflected totally within the ranges of $\theta_1-\Delta\theta\geq\theta_{ca1}$ and $\theta_1+\Delta\theta\leq\theta_{ca2}$. Then, it is also found that the reflectivity decreases drastically outside these ranges so that the laser beam L transmits through the side surfaces 4g and 4h. That is, the laser beam L is to be eliminated in the first portion 4a of the waveguide region 4 if the angle $\theta$ thereof takes $\theta<\theta_{ca1}$ or $\theta>\theta_{ca2}$. It is noted that since angular components of the laser beam L outside a predetermined range are to be thus eliminated in the first portion 4a, the area (a) of FIG. 9 can also be referred to as the filtering characteristics of the first portion 4a with respect to the angular component of the laser beam L.

The area (b) of FIG. 9 is a graph showing a correlation between the angular component of a laser beam L and the reflectivity at the side surfaces 4g and 4h in the first portion 4a when $\theta_1$ is made closer to $\theta_{ca}$. As shown in the area (b) of FIG. 9, when $\theta_1$ is made closer to $\theta_{ca}$, the angular range (=$2\Delta\theta$) of laser beam L to be reflected totally at the side surfaces 4g and 4h is made narrower. However, the total reflection critical angle $\theta_{ca}$ and/or the relative angle $\theta_1$ at the side surfaces 4g and 4h is likely to change from design values due to, for example, a change in effective refractive index with an increase in injected carrier density and/or temperature increase or a production error. In particular, in GaAs type semiconductors, since the rate of refractive index change with respect to temperature change in the active layer is smaller than the refractive index difference between inside and outside of the waveguide region only by about one digit, if the temperature change of the element due to, for example, current application is 10° C. or more (10 to 30° C. normally), the change will have an unignorable impact on the refractive index difference between the inside and outside of the waveguide region, resulting in a change in the total reflection critical angle. Also, a change in carrier density causes a change in effective refractive index due to plasma effect. Therefore, as shown in the area (a) of FIG. 9, it is preferable that the difference $\theta_1-\theta_{ca}$ between $\theta_1$ and $\theta_{ca}$ is set with some margin.

Figure 10:
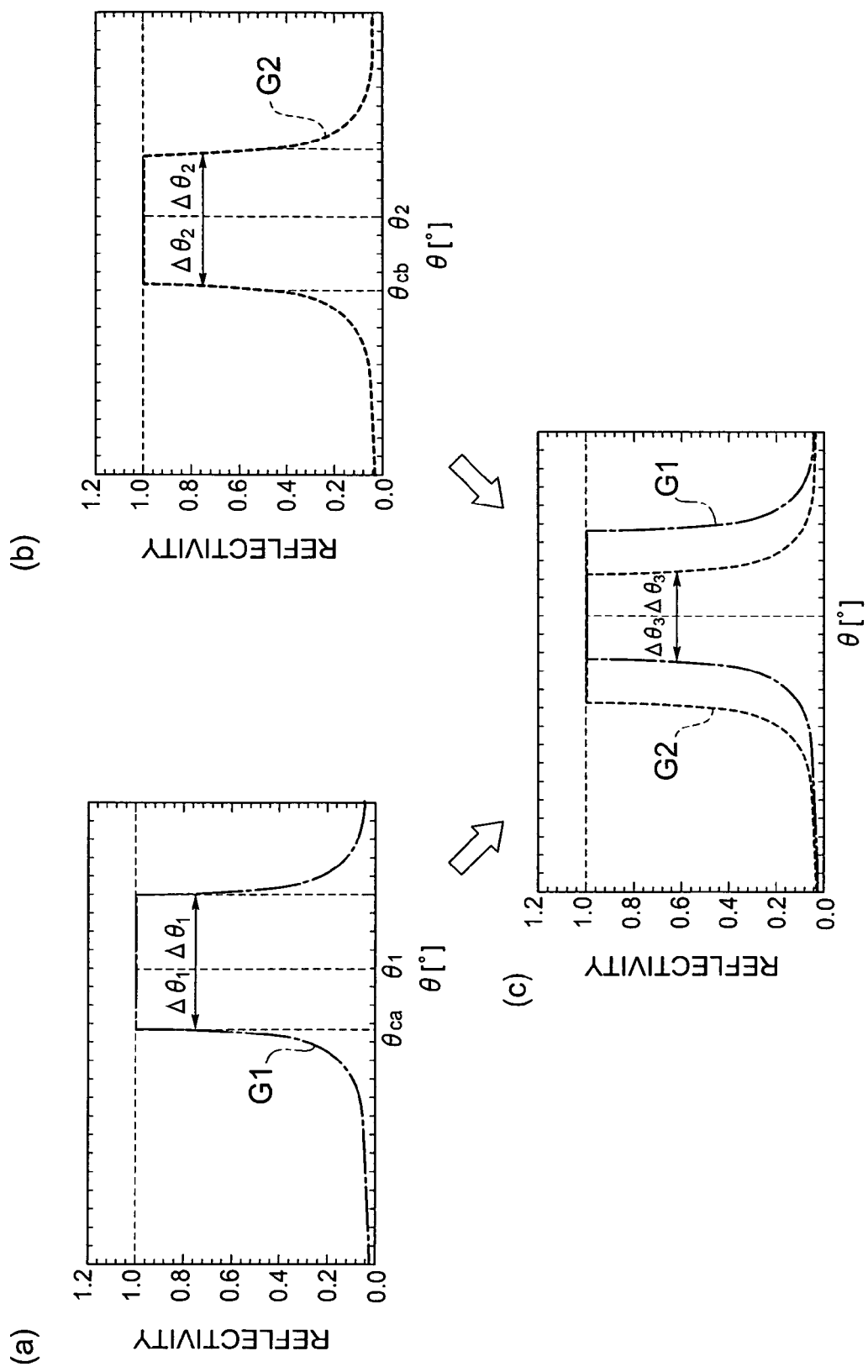
FIG. 10 shows graphs of the filtering characteristics of the waveguide region with respect to the angular component of a laser beam.

FIG. 10 shows graphs illustrating the filtering characteristics of the waveguide region 4 with respect to the angular component of a laser beam L in the semiconductor laser element 3 according to the present first embodiment. In particular, the area (a) of FIG. 10 is a graph showing the filtering characteristics of the first portion 4a with respect to the angular component of the laser beam L, while the area (b) of FIG. 10 is a graph showing the filtering characteristics of the second portion 4b with respect to the angular component of the laser beam L. Also, the area (c) of FIG. 10 is a graph showing the filtering characteristics of the entire waveguide region 4 with respect to the angular component of the laser beam L. As mentioned above, since the difference $\theta_1-\theta_{ca}$ between $\theta_1$ and $\theta_{ca}$ is set with some margin in the first portion 4a of the waveguide region 4, the angular range of the laser beam L has a constant width of $2\Delta\theta_1$ (the area (a) of FIG. 10). Since the difference $\theta_2-\theta_{cb}$ between $\theta_2$ and $\theta_{cb}$ is also set with some margin in the second portion 4b of the waveguide region 4, the angular range of the laser beam L has a constant width of $\Delta\theta_2$ (the area (b) of FIG. 10). Then, since the total reflection critical angle $\theta_{ca}$ in the first portion 4a and the total reflection critical angle $\theta_{cb}$ in the second portion 4b are different from each other, when the differences $\theta_1-\theta_{ca}$ and $\theta_2-\theta_{cb}$ are set at approximately the same value, the angular range is to be shifted mutually by the difference between the total reflection critical angle $\theta_{ca}$ and the total reflection critical angle $\theta_{cb}$. Since the laser beam L resonating in the waveguide region 4 is filtered in both the first and second portions 4a and 4b, the filtering characteristics of the entire waveguide region 4 are obtained by combining the filtering characteristics of the first portion 4a (graph G1 shown in the area (a) of FIG. 10) and the filtering characteristics of the second portion 4b (graph G2 shown in the area (b) of FIG. 10) as indicated by the graph shown in the area (c) of FIG. 10. Therefore, the width of the angular range of the laser beam L resonating in the waveguide region 4 has a width of $2\Delta\theta_3$ that is narrower than $2\Delta\theta_1$ or $2\Delta\theta_2$.

As described heretofore, in accordance with the semiconductor laser element 3 according to the present first embodiment and the semiconductor laser element array 1 to which the element is applied, since the angular range of laser beams L can be restricted narrower, it is possible to achieve laser oscillation with the space transverse mode being approximately single (space transverse single mode). Also, the intensity distribution of laser beams L emitted from the laser beam emitting end 4e is deflected to the vicinity of the direction parallel to that of the predetermined axis A, and the emitted pattern thereof is single-peaked. Further, the width of the waveguide region cannot be restricted as in single-mode semiconductor laser elements, whereby the horizontal emitting angle of laser beams L can be made narrower by widening the waveguide region 4, and it is possible to emit laser beams L with a higher intensity.

Here will be explained a method for producing the semiconductor laser element array 1 with reference to FIG. 11.

Figure 11:
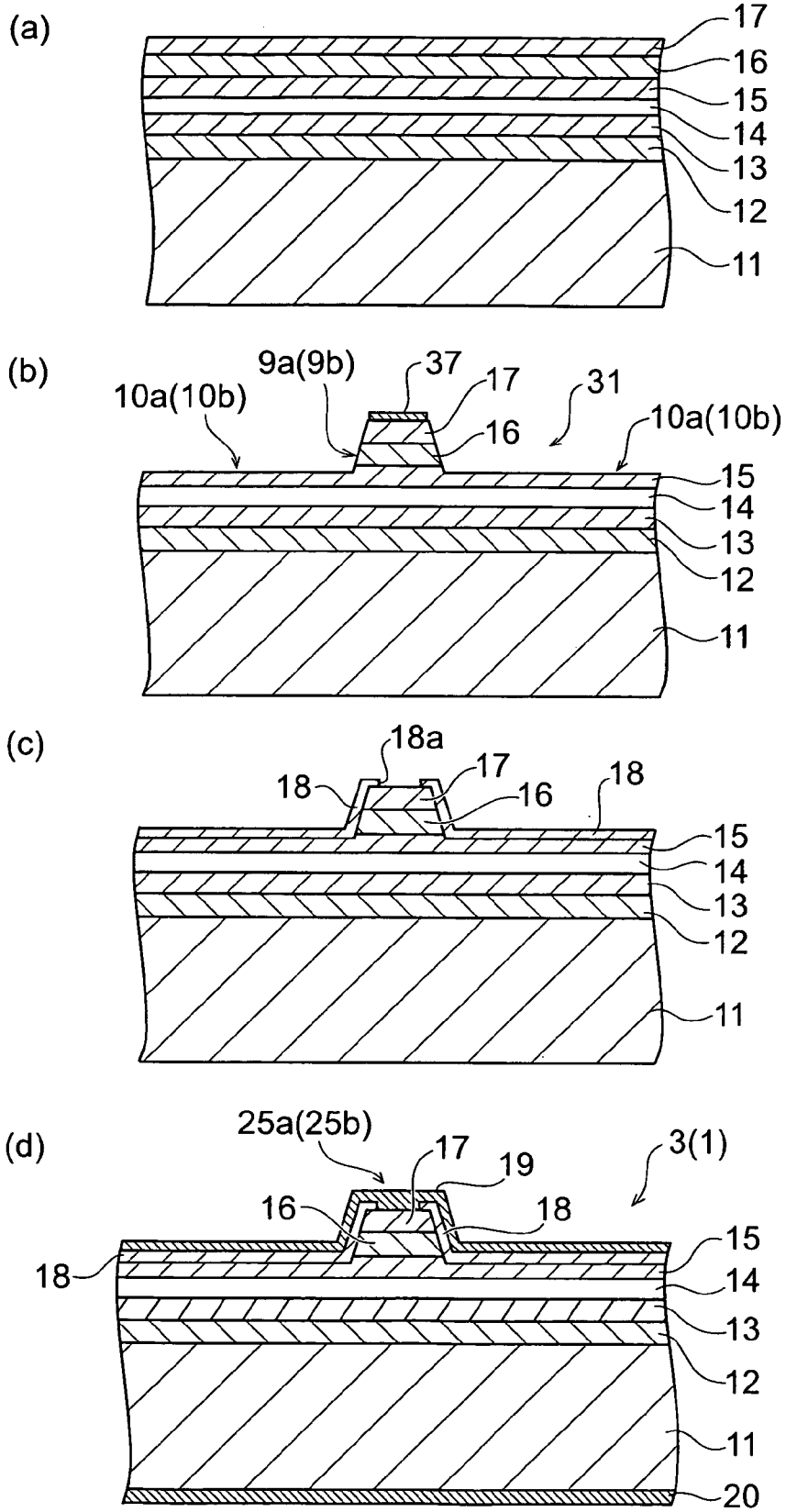
FIG. 11 shows diagrams for explaining a production process for the semiconductor laser element array according to the present invention.
Figure 12:
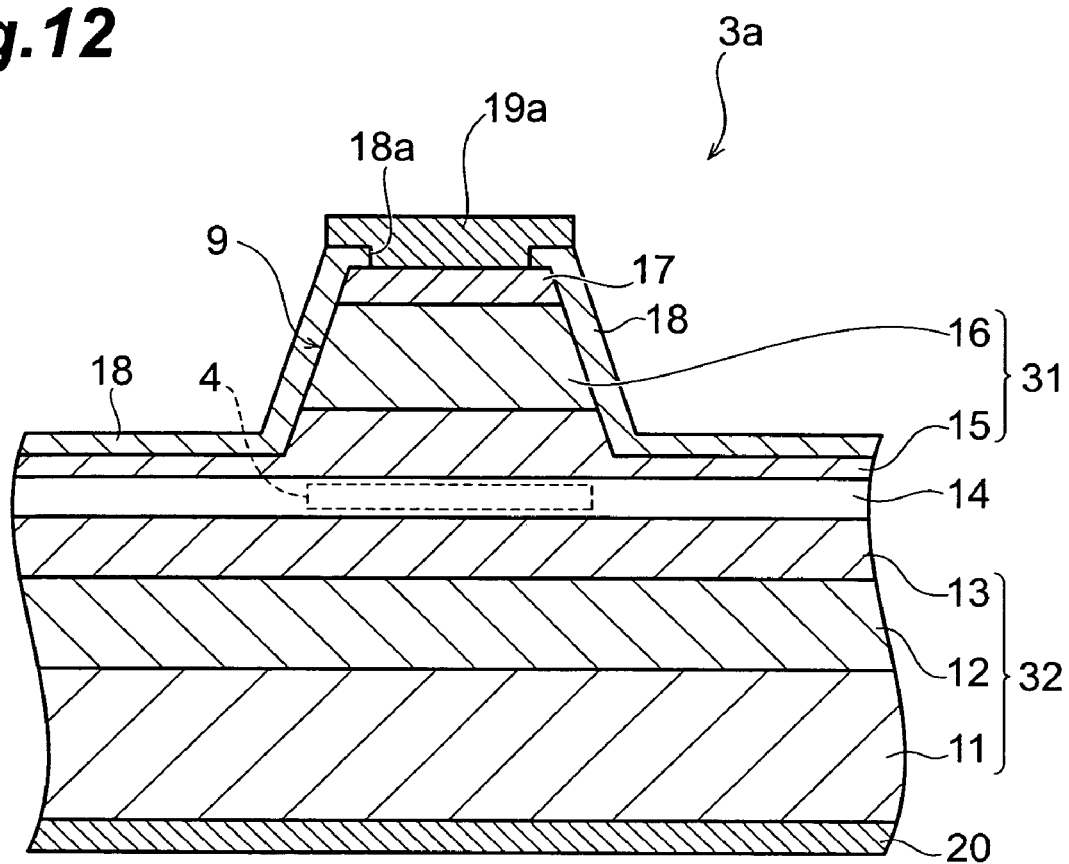
FIG. 12 is a cross-sectional view showing the configuration of a semiconductor laser element in which a p-side electrode layer is provided only above a ridge portion in a first semiconductor portion.

The areas (a) to (d) of FIG. 11 are enlarged cross-sectional views showing the structure of the semiconductor laser element array 1, particularly the vicinity of the semiconductor laser element 3 at each production process. First, when an n-GaAs substrate 11 is prepared, n-$Al_{0.35}Ga_{0.65}As$ with a film thickness of 1.2 μm, non-doped $Al_{0.15}Ga_{0.85}As$ with a film thickness of 0.4 μm, $In_{0.2}GaAs$ quantum well structure with a film thickness of 80 Å (angstrom), non-doped $Al_{0.15}Ga_{0.85}As$ with a film thickness of 0.4 μm, p-$Al_{0.35}Ga_{0.65}As$ with a film thickness of 1.2 m, and p-GaAs with a film thickness of 0.1 μm are laminated on the substrate 11 by epitaxial growth in this order. This epitaxial growth forms the n-type cladding layer 12, first optical guiding layer 13, active layer 14, second optical guiding layer 15, p-type cladding layer 16, and p-type cap layer 17 (refer to the area (a) of FIG. 11).

Subsequently, a protective mask 37 having a shape corresponding to the ridge portion 9 is formed on the p-type cap layer 17 side by photo work. In this state, the p-type cap layer 17, p-type cladding layer 16, and first optical guiding layer 15 are etched to form the first semiconductor portion 31 including the ridge portion 9. In this case, the etching is stopped at a depth not reaching the active layer 14 to form the thin portions 10a (10b). Also, in this case, the thickness of the thin portions 10a and 10b is controlled by, for example, the etching time. Specifically, the first semiconductor portion 31 is etched in accordance with the thickness of the thicker one of the thin portions 10a and 10b. Then, the first semiconductor portion 31 is further etched using etchant having a smaller etching rate with the surface of the thicker ones being covered with photoresist to form the other (thinner) thin portions (refer to the area (b) of FIG. 11).

Subsequently, insulating material such as SiN film is deposited on the entire crystal surface, and then part of the SiN film in the position corresponding to the ridge portion 9 is removed by photo work to form the insulating layer 18 (refer to the area (c) of FIG. 11). Next, Ti/Pt/Au film is formed on the entire crystal surface to obtain the p-side electrode layer 19. Also, polishing and chemical treating of the surface on the substrate 11 causes the n-side electrode layer 20 made of AuGe/Au film to be formed (refer to the area (d) of FIG. 11). The semiconductor laser element array 1 (semiconductor laser element 3) will be completed through the foregoing processes.

Next will be explained effects brought about by the semiconductor laser element 3 according to the present first embodiment. As mentioned above, in accordance with the semiconductor laser element 3, since the angular range of laser beams L can be restricted narrower, the emitted pattern thereof can be single-peaked. Also, the horizontal emitting angle of laser beams L can be made narrower by widening the waveguide region 4, and it is possible to emit laser beams L with a higher intensity.

Further, in the semiconductor laser element 3, the length of the first and second portions 4a and 4b and the spacing between the side surfaces are set in such a manner that a laser beam L1 resonating in the waveguide region 4 that is formed between the light emitting surface 1a and the light reflecting surface 1b is reflected at each of the pair of side surfaces 4g and 4h (or 4i and 4j) by the same number of times. This allows the laser beam L to be incident/reflected approximately perpendicularly at both the light emitting surface 1a and light reflecting surface 1b along the direction of the predetermined axis A. Also, since the laser beam L is reflected totally at each of the side surfaces 4g to 4j of the waveguide region 4 at least one time, there is no optical path that connects the light emitting surface 1a and light reflecting surface 1b with a straight line in the waveguide region 4. Therefore, in accordance with the semiconductor laser element 3, it is possible to restrict the optical path of laser beams L suitably in the waveguide region 4.

Further, in the semiconductor laser element 3, the total reflection critical angles $\theta_{ca}$ and $\theta_{cb}$ at the side surfaces 4g to 4j forming the respective side surfaces of the waveguide region 4 can be set arbitrarily by adjusting the thickness $t_a$ and $t_b$ of the thin portions 10a and 10b provided, respectively, along the side surfaces 9g to 9j of the ridge portion 9 that correspond to the respective side surfaces 4g to 4j. Therefore, in accordance with the semiconductor laser element 3, it is possible to achieve an arrangement easily, in which the total reflection critical angle at, at least, one portion among the side surfaces of the waveguide region 4 is different from that at another portion. Also, such a ridge structure as in the semiconductor laser element 3 has a relatively simple structure, requiring no semiconductor regrowth process as in the above-described production method. This allows a reliable semiconductor laser element 3 to be provided. It is noted that if a p-side electrode layer 19a is provided only above a ridge portion 9 in a first semiconductor portion 31 as in the semiconductor laser element 3a shown in FIG. 12, the total reflection critical angles $\theta_{ca}$ and $\theta_{cb}$ at the plurality of side surfaces 4g to 4j of the waveguide region 4 can be controlled more easily.

In accordance with the semiconductor laser element array 1 to which the semiconductor laser element 3 is applied, including a plurality of semiconductor laser elements having the above-described effects allows laser beams with a high intensity to be emitted and the horizontal emitting angle of laser beams L to be narrowed.

Further, the semiconductor laser element array 1 exhibits the following effects. That is, in the semiconductor laser element array 1, the ridge portion 9 in the first semiconductor portion 31 causes a current to be applied to the active layer 14 in a partially concentrated manner. Thus, optical coupling and/or optical interference between waveguide regions 4 of adjacent semiconductor laser elements 3 are unlikely to occur. This allows the spacing between the waveguide regions 4 to be reduced relatively. That is, more waveguide regions 4 can be provided, and it is therefore possible to emit high-powered laser beams stably. Also, applying a current to the active layer 14 in a partially concentrated manner allows electro-optical conversion efficiency to be improved and thereby reactive current to be reduced. That is, the heat generation of the semiconductor laser element 3 can be reduced. This increases the reliability of the semiconductor laser element array 1 and achieves lifetime elongation.

Here will be given a specific example of numeric values as the first embodiment. If the semiconductor laser element 3 has the material composition shown in the area (b) of FIG. 4, the refractive index $n_1$ inside the waveguide region 4 is about 3.332. Then, the thickness $t_a$ and $t_b$ of the thin portions 10a and 10b are adjusted to set the refractive index $n_2$ outside the first portion 4a to 3.324 as well as the refractive index $n_3$ outside the second portion 4b to 3.3217. In this case, the total reflection critical angle $\theta_{ca}$ at the side surfaces 4g and 4h in the first portion 4a is $\theta_{ca}=\sin^{-1}(n_2/n_1)=86°$. Also, the total reflection critical angle $\theta_{cb}$ at the side surfaces 4i and 4j in the second portion 4b is $\theta_{cb}=\sin^{-1}(n_3/n_1)=85.5°$. Here, if the differences $\Delta\theta_1=\theta_{ca}$ and $\Delta\theta_2=\theta_2-\theta_{cb}$ are both set to 1°, $\theta_1=87°$ and $\theta_2=86.5°$. In this case, although the widths $2\Delta\theta_1$ and $2\Delta\theta_2$ of the angular range of laser beams L both become 2°, since $\theta_{ca}$ and $\theta_{cb}$ are separated from each other by 0.5°, the width $2\Delta\theta_3$ of the angular range obtained by combining the angular ranges in the first and second portions 4a and 4b becomes 1.5°.

First Modification of First Embodiment

Figure 13:
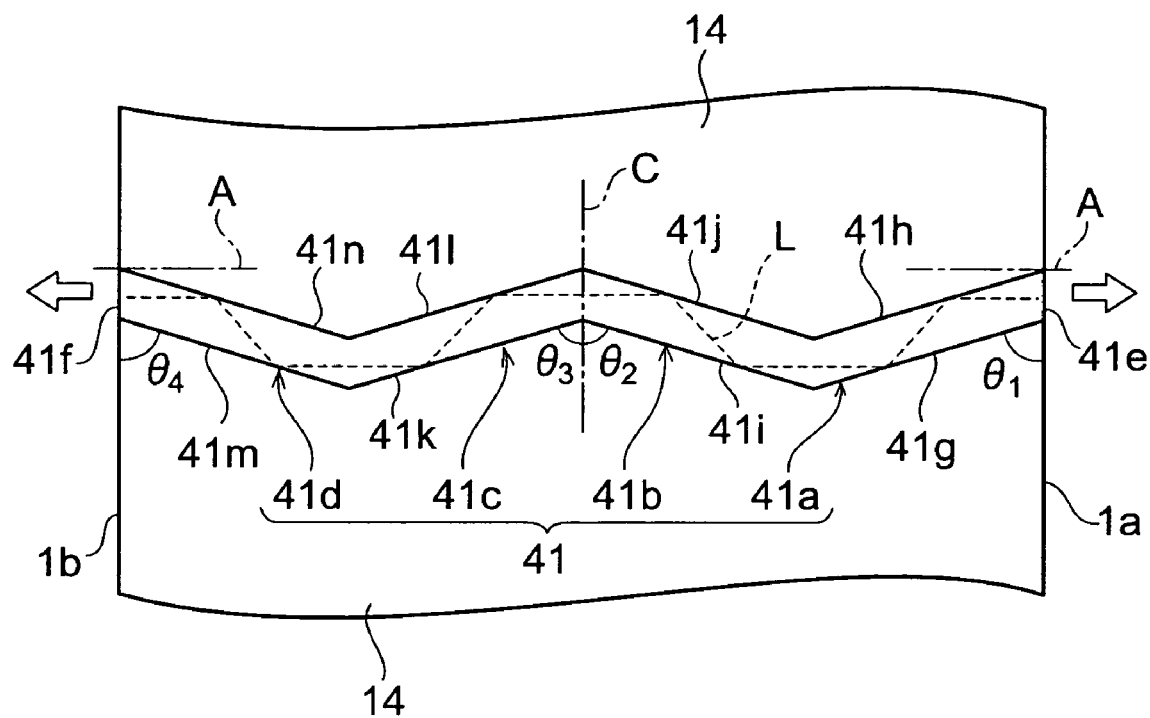
FIG. 13 is a plan view showing a waveguide region in a first modification of the semiconductor laser element according to the first embodiment.

Next will be explained a first modification of the semiconductor laser element according to the first embodiment. FIG. 13 is a plan view showing a waveguide region 41 included in a semiconductor laser element according to the present first modification. The waveguide region 41 has first to fourth portions 41a to 41d. The first portion 41a has a pair of side surfaces 41g and 41h that are opposed to each other and serve as part of the side surfaces of the waveguide region 41. One end of the first portion 41a serves as a laser beam emitting end 41e, while the other end thereof is connected with one end of the second portion 41b. The second portion 41b has a pair of side surfaces 41i and 41j that are opposed to each other and serve as another part of the side surfaces of the waveguide region 41. The other end of the second portion 41b is connected with one end of the third portion 41c. The third portion 41c has a pair of side surfaces 41k and 41l that are opposed to each other and serve as still another part of the side surfaces of the waveguide region 41. The other end of the third portion 41c is connected with one end of the fourth portion 41d. The fourth portion 41d has a pair of side surfaces 41m and 41n that are opposed to each other and serve as another part of the side surfaces of the waveguide region 41. The other end of the fourth portion 41d serves as a laser beam reflecting end 41f.

The side surfaces 41g and 41h in the first portion 41a have a relative angle of $\theta_1$ to the light emitting surface 1a and light reflecting surface 1b. The side surfaces 41i and 41j in the second portion 41b have a relative angle of $\theta_2$ to the light emitting surface 1a and light reflecting surface 1b, and are connected with the side surfaces 41g and 41h at an angle of $\theta_1+\theta_2$. The side surfaces 41k and 41l in the third portion 41c have a relative angle of $\theta_3$ to the light emitting surface 1a and light reflecting surface 1b, and are connected with the side surfaces 41i and 41j at an angle of $\theta_2+\theta_3$. The side surfaces 41m and 41n in the fourth portion 41d have a relative angle of $\theta_4$ to the light emitting surface 1a and light reflecting surface 1b, and are connected with the side surfaces 41k and 41l at an angle of $\theta_3+\theta_4$. The angles $\theta_1$ to $\theta_4$ are set differently from each other. The total reflection critical angle $\theta_{ca}$ at the side surfaces 41g and 41h in the first portion 41a, total reflection critical angle $\theta_{cb}$ at the side surfaces 41i and 41j in the second portion 41b, total reflection critical angle $\theta_{cc}$ at the side surfaces 41k and 41l in the third portion 41c, and total reflection critical angle $\theta_{cd}$ at the side surfaces 41m and 41n in the fourth portion 41d are controlled by, for example, the thickness of thin portions so that $\theta_1$ to $\theta_4$ are respectively greater than $\theta_{ca}$ to $\theta_{cd}$ by a predetermined angle. It is noted that the auxiliary line C in FIG. 13 is parallel with the light emitting surface 1a and light reflecting surface 1b.

Laser beams L reflected at the laser beam reflecting end 41f along the direction of the predetermined axis A are to be reflected totally at the side surfaces 41n, 41m, 41k, 41l, 41j, 41i, 41g, and 41h in this order to be incident on the laser beam emitting end 41e along the direction of the predetermined axis A. A part of the laser beams L reaching the laser beam emitting end 41e is reflected at the laser beam emitting end 41e, and then reaches the laser beam reflecting end 41f through the above-described optical path reversely. Thus, the laser beams L will resonate between the laser beam emitting end 41e and laser beam reflecting end 41f.

In the semiconductor laser element according to the present invention, any number of portions having their respective different relative angles and total reflection critical angles may be included in the side surfaces of the waveguide region as in the present first modification. The more the side surfaces of the waveguide region include such portions, the more strongly the filtering effects for the angular component of laser beams L can be enhanced.

Second Modification of First Embodiment

Figure 14:
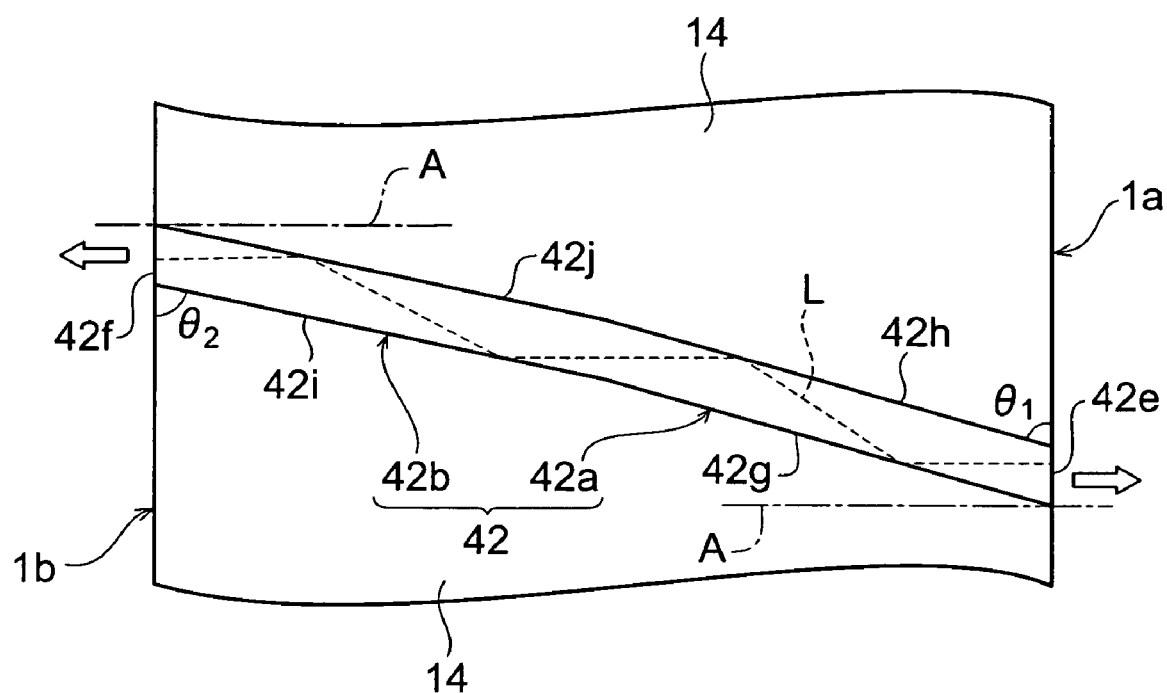
FIG. 14 is a plan view showing a waveguide region in a second modification of the semiconductor laser element according to the first embodiment.

Next will be explained a second modification of the semiconductor laser element according to the first embodiment. FIG. 14 is a plan view showing a waveguide region 42 included in a semiconductor laser element according to the present second modification. The waveguide region 42 has first and second portions 42a and 42b. The first portion 42a has a pair of side surfaces 42g and 42h that are opposed to each other and serve as part of the side surfaces of the waveguide region 42. One end of the first portion 42a serves as a laser beam emitting end 42e, while the other end thereof is connected with one end of the second portion 42b. The second portion 42b has a pair of side surfaces 42i and 42j that are opposed to each other and serve as another part of the side surfaces of the waveguide region 42. The other end of the second portion 42b serves as a laser beam reflecting end 42f.

The side surfaces 42g and 42h in the first portion 42a have a relative angle of 61 to the light emitting surface 1a and light reflecting surface 1b. The side surfaces 42i and 42j in the second portion 42b have a relative angle of $\theta_2$ to the light emitting surface 1a and light reflecting surface 1b, and are connected with the side surfaces 42g and 42h at an angle of $\theta_1+(180°-\theta_2)$. The angles $\theta_1$ and $\theta_2$ are set differently from each other. The total reflection critical angle $\theta_{ca}$ at the side surfaces 42g and 42h in the first portion 42a and the total reflection critical angle $\theta_{cb}$ at the side surfaces 42i and 42j in the second portion 42b are controlled by, for example, the thickness of thin portions so that $\theta_1$ and $\theta_2$ are respectively greater than $\theta_{ca}$ and $\theta_{cb}$ by a predetermined angle.

Laser beams L reflected at the laser beam reflecting end 42f along the direction of the predetermined axis A are to be reflected totally at the side surfaces 42j, 42i, 42h, and 42g in this order to be incident on the laser beam emitting end 42e along the direction of the predetermined axis A. A part of the laser beams L reaching the laser beam emitting end 42e is reflected at the laser beam emitting end 42e, and then reaches the laser beam reflecting end 42f through the above-described optical path reversely. Thus, the laser beams L will resonate between the laser beam emitting end 42e and laser beam reflecting end 42f.

In the semiconductor laser element according to the present invention, each portion of the side surfaces of the waveguide region 42 may be inclined in the same direction with respect to the light emitting surface 1a and light reflecting surface 1b as in the present second modification. Also in accordance with such an arrangement, the same effect as in the semiconductor laser element according to the first embodiment can be achieved.

Third Modification of First Embodiment

Figure 15:
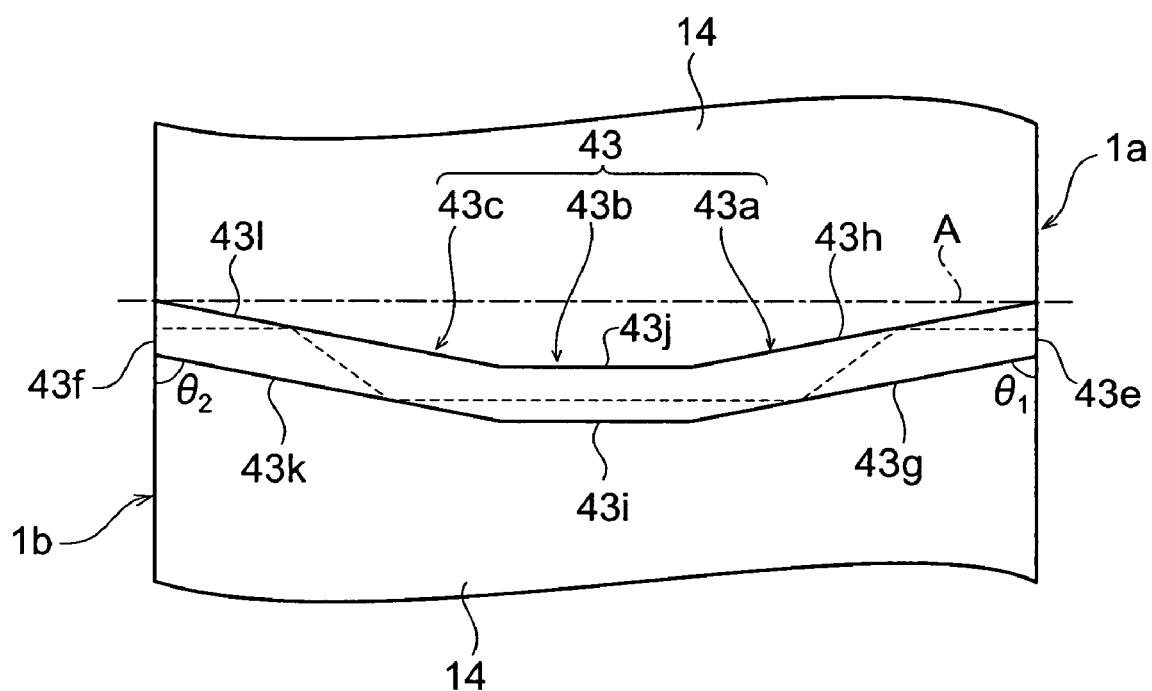
FIG. 15 is a plan view showing a waveguide region in a third modification of the semiconductor laser element according to the first embodiment.

Next will be explained a third modification of the semiconductor laser element according to the first embodiment. FIG. 15 is a plan view showing a waveguide region 43 included in a semiconductor laser element according to the present third modification. The waveguide region 43 has first and third portions 43a and 43c and a second portion 43b positioned between the first and third portions 43a and 43c. The first portion 43a has a pair of side surfaces 43g and 43h that are opposed to each other and serve as part of the side surfaces of the waveguide region 43. One end of the first portion 43a serves as a laser beam emitting end 43e, while the other end thereof is connected with one end of the second portion 43b.

The second portion 43b has a pair of side surfaces 43i and 43j that are opposed to each other and serve as another part of the side surfaces of the waveguide region 43. The other end of the second portion 43b is connected with one end of the third portion 43c. The third portion 43c has a pair of side surfaces 43k and 43l that are opposed to each other and serve as still another part of the side surfaces of the waveguide region 43. The other end of the third portion 43c serves as a laser beam reflecting end 43f.

The side surfaces 43g and 43h in the first portion 43a have a relative angle of $\theta_1$ to the light emitting surface 1a and light reflecting surface 1b. The side surfaces 43i and 43j in the second portion 43b extend along the direction of the predetermined axis A and approximately perpendicularly to the light emitting surface 1a and light reflecting surface 1b. The side surfaces 43k and 43l in the third portion 43c have a relative angle of $\theta_2$ to the light emitting surface 1a and light reflecting surface 1b, and also have a relative angle of $\theta_1+\theta_2$ to the side surfaces 43g and 43h. The angles $\theta_1$ and $\theta_2$ are set differently from each other. The total reflection critical angle $\theta_{ca}$ at the side surfaces 43g and 43h in the first portion 43a and the total reflection critical angle $\theta_{cc}$ at the side surfaces 43k and 43l in the third portion 43b are controlled by, for example, the thickness of thin portions so that $\theta_1$ and $\theta_2$ are respectively greater than $\theta_{ca}$ and $\theta_{cc}$ by a predetermined angle.

Laser beams L reflected at the laser beam reflecting end 43f along the direction of the predetermined axis A are to be reflected totally at the side surfaces 43l and 43k in this order to reach the second portion 43b of the waveguide region 43 along the direction of the predetermined axis A. The laser beams L pass through the second portion 43b along the side surfaces 43i and 43j in the second portion 43b. The laser beams L are to be reflected totally at the side surfaces 43g and 43h in the first portion 43a in this order to be incident on the laser beam emitting end 43e along the direction of the predetermined axis A. A part of the laser beams L reaching the laser-beam emitting end 43e is reflected at the laser beam emitting end 43e, and then reaches the laser beam reflecting end 43f through the above-described optical path reversely. Thus, the laser beams L will resonate between the laser beam emitting end 43e and laser beam reflecting end 43f.

In the semiconductor laser element according to the present invention, it is preferable to have a second portion 43b positioned between first and third portions 43a and 43c and having side surfaces 43i and 43j along the direction of the predetermined axis A as in the present third modification. This arrangement can absorb angle variation at the boundaries between each pair of portions when laser beams L resonate in the waveguide region 43, whereby the loss of laser beams L at the boundaries between each pair of portions can be reduced effectively. Laser beams L to be emitted from the laser beam emitting end 43e and laser beam reflecting end 43f in directions different from that of the predetermined axis A (side-mode light) can also be reduced effectively.

Second Embodiment

FIG. 16 shows cross-sectional views of the configuration of second embodiment of a semiconductor laser element according to the present invention. The semiconductor laser element according to the present second embodiment can also be applied to such a semiconductor laser element array as shown in FIG. 2. In particular, the area (a) of FIG. 16 shows the cross-sectional structure of the semiconductor laser element according to the present second embodiment, the cross-sectional view corresponding to the cross-section I-I shown in FIG. 2. The area (b) of FIG. 16 also shows the cross-sectional structure of the semiconductor laser element according to the present second embodiment, the cross-sectional view corresponding to the cross-section II-II shown in FIG. 2.

One of the differences between the semiconductor laser element 3b according to the present second embodiment and the semiconductor laser element 3 according to the first embodiment is the thickness of the thin portions 10. In the semiconductor laser element 3b according to the second embodiment, the thin portions 10 have a uniform thickness regardless of along what part of the ridge portion 9 the thin portions are provided. Also, another one of the differences between the semiconductor laser element 3b according to the second embodiment and the semiconductor laser element 3 according to the first embodiment is the existence of current blocking portions. The semiconductor laser element 3b according to the second embodiment includes current blocking portions 21a to 21d instead of the insulating layer 18 in the first embodiment. It is noted that since the other components of the semiconductor laser element 3b are identical to those of the semiconductor laser element 3 according to the first embodiment, detailed descriptions thereof will be omitted.

The current blocking portions 21a to 21d are for applying a current to the ridge portion 9 in a concentrated manner. The current blocking portions 21a to 21d are made of, for example, semiconductor material of the conductivity type opposite that of the first semiconductor portion 31 or insulating material. In the present second embodiment, the current blocking portions 21a to 21d are made of, for example, n-GaAs or n-Al$_x$Ga$_{1-x}$As (0<x<0.3). The current blocking portions 21a and 21b are provided on the thin portions 10 along the side surfaces 9g and 9h in the first portion 9a of the ridge portion 9 (the area (a) of FIG. 16). The current blocking portions 21c and 21d are provided on the thin portions 10 along the side surfaces 9i and 9j in the second portion 9b of the ridge portion 9 (the area (b) of FIG. 16). The p-side electrode layer 22 is provided on the ridge portion 9 and the current blocking portions 21a to 21d and is in contact with the p-type cap layer 17 on the ridge portion 9.

When a current is applied to the portion of the active layer 14 that corresponds to the ridge portion 9 in a concentrated manner, there is formed a refractive index type waveguide region 5 correspondingly to the shape of the ridge portion 9. The side surfaces 5g to 5j of the waveguide region 5 are generated by the refractive index difference between the inside and outside of the waveguide region 5 and may have a constant thickness if the refractive index varies continuously.

The relative angle between the side surfaces 5g and 5h in the first portion 5a of the waveguide region 5 and the light emitting surface 1a and light reflecting surface 1b (refer to FIG. 2) is decided based on the total reflection critical angle $\theta_{ca}$ at the side surfaces 5g and 5h. In the present embodiment, the total reflection critical angle $\theta_{ca}$ depends on the material composition of the current blocking portions 21a and 21b. That is, when the material composition of the current blocking portions 21a and 21b (e.g. composition ratio "x" of n-Al$_x$Ga$_{1-x}$As) is changed, the refractive index of the current blocking portions 21a and 21b also changes. Therefore, since the effective refractive index difference at the side surfaces 5g and 5h changes, the total reflection critical angle $\theta_{ca}$ also changes.

In addition, the relative angle between the side surfaces 5i and 5j in the second portion 5b of the waveguide region 5 and the light emitting surface 1a and light reflecting surface 1b (refer to FIG. 2) is decided based on the total reflection critical angle $\theta_{cb}$ at the side surfaces 5i and 5j. The total reflection critical angle $\theta_{cb}$ depends on the material composition of the current blocking portions 21c and 21d. Therefore, the total reflection critical angle $\theta_{cb}$ at the side surfaces 5*i* and 5*j* in the second portion 5*b* and the total reflection critical angle $\theta_{ca}$ at the side surfaces 5*g* and 5*h* in the first portion 5*a* can be made different arbitrarily from each other by controlling the material composition of the current blocking portions 21*a* and 21*b* and that of the current blocking portions 21*c* and 21*d* separately.

Thus, in accordance with the semiconductor laser element 3*b* according to the second embodiment, the total reflection critical angle $\theta_{ca}$ ($\theta_{cb}$) at the side surfaces 5*g* to 5*j* of the waveguide region 5 can be set arbitrarily by adjusting the material composition of the current blocking portions 21*a* to 21*d* along the respective side surfaces 9*g* to 9*j* of the ridge portion 9 that correspond to the respective side surfaces 5*g* to 5*j*. In addition, in accordance with the semiconductor laser element 3*b*, it is possible to achieve an arrangement easily, in which the total reflection critical angle at, at least, one portion among the side surfaces of the waveguide region 5 is different from that at another portion. Especially, in the semiconductor laser element 3*b*, since the total reflection critical angle $\theta_{ca}$ ($\theta_{cb}$) can be adjusted by the material composition of the current blocking portions 21*a* to 21*d*, the total reflection critical angle $\theta_{ca}$ ($\theta_{cb}$) can be controlled more accurately than the method of adjustment by the etching depth as in the above-described first embodiment.

It is noted that although the thin portions 10 have a uniform thickness in the present second embodiment, the total reflection critical angle at the side surfaces of the waveguide region may be controlled by the thickness of the thin portions with the material composition of the current blocking portions being kept uniform. Alternatively, the total reflection critical angle at the side surfaces of the waveguide region may be controlled by both the material composition of the current blocking portions and the thickness of the thin portions.

Third Embodiment

FIG. 17 shows cross-sectional views of the configuration of a third embodiment of a semiconductor laser element according to the present invention. The semiconductor laser element according to the present third embodiment can also be applied to such a semiconductor laser element array as shown in FIG. 2. In particular, the area (a) of FIG. 17 shows the cross-sectional structure of the semiconductor laser element according to the third embodiment, the cross-sectional view corresponding to the cross-section I-I shown in FIG. 2. The area (b) of FIG. 17 also shows the cross-sectional structure of the semiconductor laser element according to the third embodiment, the cross-sectional view corresponding to the cross-section II-II shown in FIG. 2. It is noted that the semiconductor laser element 3*c* according to the present third embodiment has a so-called buried-heterostructure.

Referring to FIG. 17, the semiconductor laser element 3*c* according to the present third embodiment includes: a first semiconductor portion 33; a second semiconductor portion 34; and an active layer 35 provided between the first and second semiconductor portions 33 and 34. The first semiconductor portion 33 includes a p-type cladding layer 27 and a first optical guiding layer 26. The second semiconductor portion 34 includes an n-type semiconductor substrate 11, an n-type cladding layer 23, and a second optical guiding layer 24. The semiconductor laser element 3*c* also includes a p-type cap layer 28. The n-type cladding layer 23, second optical guiding layer 24, active layer 35, first optical guiding layer 26, p-type cladding layer 27, and p-type cap layer 28 are laminated on the substrate 11 in this order to form a laminated body 7. The laminated body 7 has a first portion 7*a* shown in the area (a) of FIG. 17 and a second portion 7*b* shown in the area (b) of FIG. 17. The first portion 7*a* has a pair of side surfaces 7*g* and 7*h*. The side surfaces 7*g* and 7*h* have a relative angle of $\theta_1$ to the light emitting surface 1*a* and light reflecting surface 1*b* when viewed in the thickness direction of the laminated body 7. The second portion 7*b* has a pair of side surfaces 7*i* and 7*j*. The side surfaces 7*i* and 7*j* have a relative angle of $\theta_2$ ($\neq \theta_1$) to the light emitting surface 1*a* and light reflecting surface 1*b* when viewed in the thickness direction of the laminated body 7. The side surfaces 35*g* to 35*j* of the active layer 35 are included, respectively, in the side surfaces 7*g* to 7*j* of the laminated body 7.

The semiconductor laser element 3*c* also includes current blocking portions 29*a* to 29*d*, a p-side electrode layer 30, and an n-side electrode layer 20. Among these components, the arrangement of the n-side electrode layer 20 is the same as in the first embodiment.

The current blocking portions 29*a* to 29*d* are for constricting and applying a current to the active layer 35. The current blocking portions 29*a* to 29*d* are made of, for example, non-doped semiconductor material such as i-$Al_xGa_{1-x}As$ (0<x<0.3) or insulating material. The current blocking portions 29*a* and 29*b* are provided on the substrate 11 along the respective side surfaces 7*g* and 7*h* of the laminated body 7 (i.e. along the side surfaces 35*g* and 35*h* of the active layer 35) (the area (a) of FIG. 17). Also, the current blocking portions 29*c* and 29*d* are provided on the substrate 11 along the respective side surfaces 7*i* and 7*j* of the laminated body 7 (i.e. along the side surfaces 35*i* and 35*j* of the active layer 35) (the area (b) of FIG. 17). The p-side electrode layer 30 is provided on the laminated body 7 and the current blocking portions 29*a* to 29*d* and is in contact with the p-type cap layer 28 on the laminated body 7.

In the active layer 35, there is formed a waveguide region 2 due to refractive index difference between the inside and outside of the active layer at the side surfaces 35*g* to 35*j*. The waveguide region 2 has a first portion 2*a* formed in the first portion 7*a* of the laminated body 7 and a second portion 2*b* formed in the second portion 7*b* of the laminated body 7. The first portion 2*a* of the waveguide region 2 has side surfaces 2*g* and 2*h* defined by the side surfaces 35*g* and 35*h* of the active layer 35 and serving as part of the side surfaces of the waveguide region 2. The side surfaces 2*g* and 2*h* have a relative angle of $\theta_1$ to the light emitting surface 1*a* and light reflecting surface 1*b* (refer to FIG. 2). The second portion 2*b* of the waveguide region 2 also has side surfaces 2*i* and 2*j* defined by the side surfaces 35*i* and 35*j* of the active layer 35 and serving as another part of the side surfaces of the waveguide region 2. The side surfaces 2*i* and 2*j* have a relative angle of $\theta_2$ ($\neq \theta_1$) to the light emitting surface 1*a* and light reflecting surface 1*b*.

The relative angle $\theta_1$ between the side surfaces 2*g* and 2*h* in the first portion 2*a* of the waveguide region 2 and the light emitting surface 1*a* and light reflecting surface 1*b* is decided based on the total reflection critical angle $\theta_{ca}$ at the side surfaces 2*g* and 2*h*. In the present third embodiment, the total reflection critical angle $\theta_{ca}$ depends on the refractive index difference between the current blocking portions 29*a* and 29*b* and the active layer 35. The refractive index difference can be set arbitrarily by adjusting, for example, the material composition of the current blocking portions 29*a* and 29*b*.

Also, the relative angle between the side surfaces 2*i* and 2*j* in the second portion 2*b* of the waveguide region 2 and the light emitting surface 1*a* and light reflecting surface 1*b* is decided based on the total reflection critical angle $\theta_{cb}$ at the side surfaces 2*i* and 2*j*. The total reflection critical angle $\theta_{cb}$ depends on the refractive index difference between the current blocking portions 29c and 29d and the active layer 35. The refractive index difference can be set arbitrarily by adjusting, for example, the material composition of the current blocking portions 29c and 29d. Therefore, the total reflection critical angle θca at the side surfaces 2g and 2h in the first portion 2a of the waveguide region 2 and the total reflection critical angle $\theta_{cb}$ at the side surfaces 2i and 2j in the second portion 2b can be set differently from each other by controlling, respectively, the refractive index difference between the current blocking portions 29a and 29b and the active layer 35 and the refractive index difference between the current blocking portions 29c and 29d and the active layer 35.

Thus, in accordance with the semiconductor laser element 3c according to the present third embodiment, the total reflection critical angle $\theta_{ca}$ ($\theta_{cb}$) at the side surfaces 2g to 2j of the waveguide region 2 can be set arbitrarily by adjusting the refractive index difference between the current blocking portions 29a to 29d and the active layer 35 that correspond to the respective side surfaces 2g to 2j. It is therefore possible to achieve an arrangement easily, in which the total reflection critical angle at, at least, one portion among the side surfaces of the waveguide region 2 is different from that at another portion.

Fourth Embodiment

Figure 18:
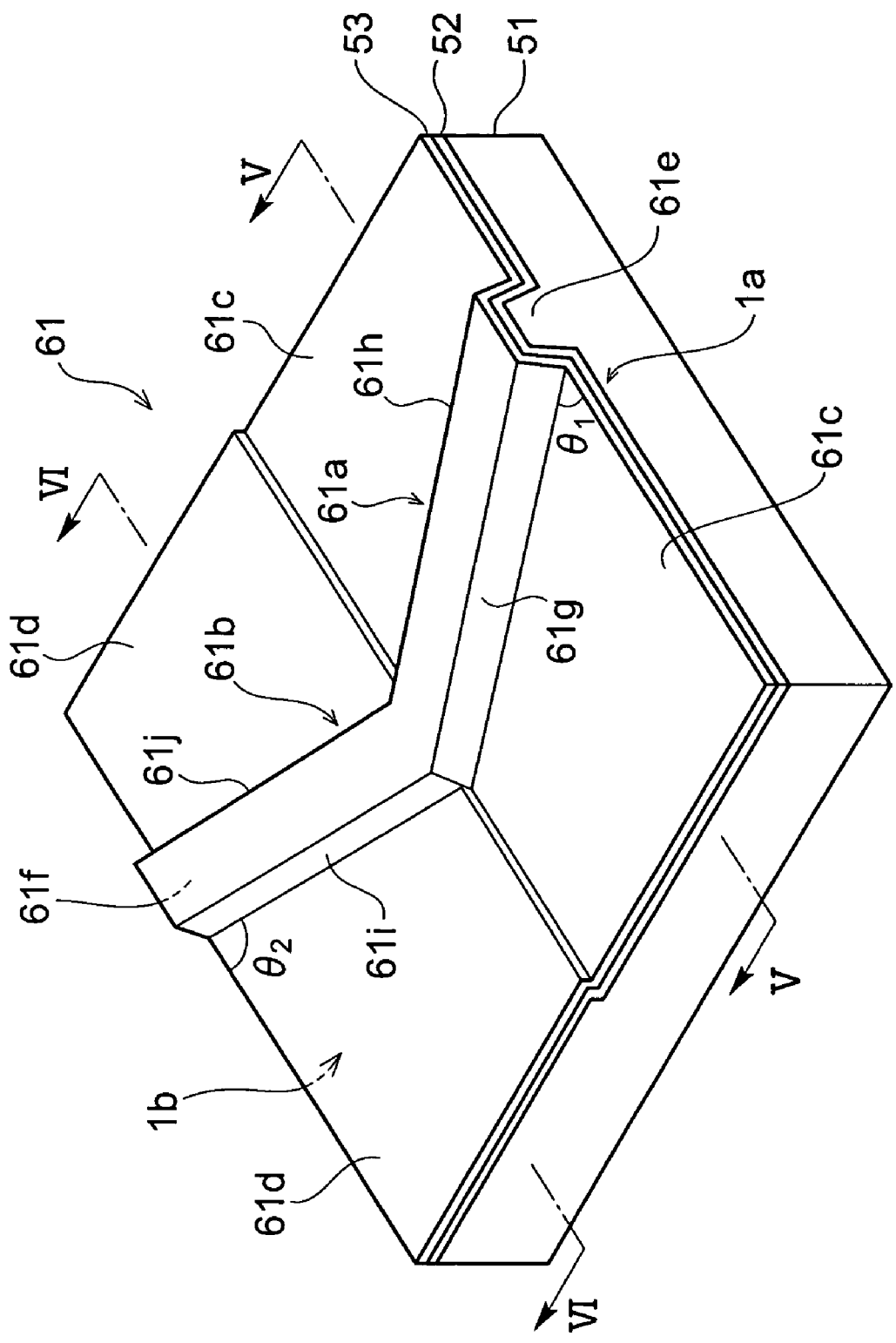
FIG. 18 is a perspective view showing a part of a second semiconductor portion in a fourth embodiment of a semiconductor laser element according to the present invention.

Next will be explained a semiconductor laser element according to a fourth embodiment of the present invention. FIG. 18 is a perspective view showing a part of a second semiconductor portion included in the semiconductor laser element according to the fourth embodiment. Also, the area (a) of FIG. 19 is an enlarged cross-sectional view of the semiconductor laser element at the cross-section V-V shown in FIG. 18, and the area (b) of FIG. 19 is an enlarged cross-sectional view of the semiconductor laser element at the cross-section VI-VI shown in FIG. 18. It is noted that the semiconductor laser element 3d according to the present fourth embodiment can also be applied to such a semiconductor laser element array as shown in FIG. 2.

The semiconductor laser element 3d according to the present fourth embodiment includes a second semiconductor portion 61. Referring to FIGS. 18 and 19, the second semiconductor portion 61 includes an n-type semiconductor substrate 51, an n-type cladding layer 52 laminated on the substrate 51, and a second optical guiding layer 53 laminated on the n-type cladding layer 52. The second semiconductor portion 61 also has a first surface 61c arranged on the light emitting surface 1a side and a second surface 61d arranged on the light reflecting surface 1b side. The first surface 61c is formed lower than the second surface 61d (i.e. with a smaller distance from the underside of the substrate 51).

The second semiconductor portion 61 also has ridge portions 61a and 61b. The ridge portion 61a is formed at a position dividing the first surface 61c and has a pair of side surfaces 61g and 61h serving as boundaries between the first surface 61c and the ridge portion 61a. The side surfaces 61g and 61h have a relative angle of $\theta_1$ to the light emitting surface 1a and light reflecting surface 1b when viewed in the thickness direction of the second semiconductor portion 61. One end of the ridge portion 61a extends to the light emitting surface 1a to form an end face 61e, while the other end of the ridge portion 61a is connected with one end of the ridge portion 61b. Also, the ridge portion 61b is formed at a position dividing the second surface 61d and has a pair of side surfaces 61i and 61j serving as boundaries between the second surface 61d and the ridge portion 61b. The side surfaces 61i and 61j have a relative angle of $\theta_2$ to the light emitting surface 1a and light reflecting surface 1b when viewed in the thickness direction of the second semiconductor portion 61. The other end of the ridge portion 61b extends to the light reflecting surface 1b to form an end face 61f. Since the first surface 61c is formed lower than the second surface 61d, the height ha of the side surfaces 61g and 61h of the ridge portion 61a based on the first surface 61c is greater than the height hb of the side surfaces 61i and 61j of the ridge portion 61b based on the second surface 61d.

The ridge portions 61a and 61b of the second semiconductor portion 61 are formed by etching portions in the substrate 51 other than those corresponding to the ridge portions 61a and 61b. In this case, the first surface 61c can be formed lower than the second surface 61d by applying different etching times between the area on the substrate 51 that corresponds to the first surface 61c and the area on the substrate 51 that corresponds to the second surface 61d.

The semiconductor laser element 3d also includes a first semiconductor portion 60, an active layer 54 positioned between the first and second semiconductor portions 60 and 61, and a p-type cap layer 57. The first semiconductor portion 60 includes a first optical guiding layer 55 and a p-type cladding layer 56. The active layer 54, first optical guiding layer 55, p-type cladding layer 56, and p-type cap layer 57 are laminated on the second semiconductor portion 61 including the ridge portions 61a and 61b in this order.

The semiconductor laser element 3d further includes an insulating film 58, a p-side electrode layer 59, and an n-side electrode layer 64. The p-side electrode layer 59 is provided above the p-type cap layer 57, and the insulating film 58 is provided between the p-side electrode layer 59 and the p-type cap layer 57. In the insulating film 58, there is formed an opening portion 58a as first current concentrating means in the area corresponding to the ridge portions 61a and 61b of the second semiconductor portion 61, the p-side electrode layer 59 and the p-type cap layer 57 being in contact with each other via the opening portion 58a. Also, in the area of the p-type cladding layer 56 that corresponds to the opening portion 58a of the insulating film 58, Zn is diffused to form a low-resistance region 56a as second current concentrating means. The opening portion 58a and low-resistance region 56a are means for applying a current to the area in the active layer 54 above the ridge portions 61a and 61b. The n-side electrode layer 64 is provided on the surface of the substrate 51 on the opposite side to the first and second surfaces 61c and 61d.

When a current is applied to the area of the active layer 54 that corresponds to the opening portion 58a of the insulating film 58 (i.e. the area corresponding to the ridge portions 61a and 61b) in a concentrated manner, there are generated first and second portions 6a and 6b in a waveguide region 6 correspondingly to the shape of the ridge portions 61a and 61b. The side surfaces 6g to 6j of the waveguide region 6 are generated by the refractive index difference between the first optical guiding layer 55 and p-type cladding layer 56, which cover the active layer 54, and the active layer 54, the planar shape thereof being defined by the side surfaces 61g to 61j of the ridge portions 61a and 61b. It is noted that the side surfaces 6g to 6j of the waveguide region 6 may have a constant thickness if the refractive index of the first optical guiding layer 55 and p-type cladding layer 56 varies continuously.

The relative angle $\theta_1$ between the side surfaces 6g and 6h in the first portion 6a of the waveguide region 6 and the light emitting surface 1a and light reflecting surface 1b (refer to FIG. 2) is decided based on the total reflection critical angle θca at the side surfaces 6g and 6h. In the present fourth embodiment, the total reflection critical angle $\theta_{ca}$ at the side surfaces 6g and 6h depends on the height ha of the side surfaces 61g and 61h of the ridge portion 61a that correspond to the respective side surfaces 6g and 6h.

In addition, the relative angle $\theta_2$ between the side surfaces 6i and 6j in the second portion 6b of the waveguide region 6 and the light emitting surface 1a and light reflecting surface 1b (refer to FIG. 2) is decided based on the total reflection critical angle $\theta_{cb}$ at the side surfaces 6i and 6j in the second portion 6b of the waveguide region 6. The total reflection critical angle $\theta_{cb}$ at the side surfaces 6i and 6j depends on the height hb of the side surfaces 61i and 61j of the ridge portion 61b that correspond to the respective side surfaces 6i and 6j. Therefore, the total reflection critical angle $\theta_{ca}$ at the side surfaces 6g and 6h in the first portion 6a and the total reflection critical angle $\theta_{cb}$ at the side surfaces 6i and 6j in the second portion 6b can be made different arbitrarily from each other by controlling the height ha of the side surfaces 61g and 61h of the ridge portion 61a and the height hb of the side surfaces 61i and 61j of the ridge portion 61b separately.

Thus, in accordance with the semiconductor laser element 3d according to the present fourth embodiment, the total reflection critical angle $\theta_{ca}$ ($\theta_{cb}$) at the side surfaces 6g to 6j of the waveguide region 6 can be set arbitrarily by adjusting the height of the side surfaces 61g to 61j of the ridge portion 61a (61b) that correspond to the respective side surfaces 6g to 6j. Therefore, in accordance with the semiconductor laser element 3d, it is possible to achieve an arrangement easily, in which the total reflection critical angle at, at least, one portion among the side surfaces of the waveguide region 6 is different from that at another portion. In particular, the semiconductor laser element 3d has a relatively simple structure, requiring no semiconductor regrowth process. This allows a reliable semiconductor laser element 3d to be provided.

The total reflection critical angle $\theta_{ca}$ ($\theta_{cb}$) at the side surfaces 6g and 6h (or side surfaces 6i and 6j) depends also on the material composition of the first optical guiding layer 55 and n-type cladding layer 56 above the ridge portion 61a (61b). Therefore, the total reflection critical angle $\theta_{ca}$ at the side surfaces 6g and 6h in the first portion 6a and the total reflection critical angle $\theta_{cb}$ at the side surfaces 6i and 6j in the second portion 6b can be made different arbitrarily from each other by controlling the material composition of the first optical guiding layer 55 and n-type cladding layer 56, respectively, above the ridge portions 61a and 61b.

Also, in the present fourth embodiment, the ridge portions 61a and 61b of the second semiconductor portion 61 are formed by etching portions in the substrate 51 other than those corresponding to the ridge portions 61a and 61b. In addition to this, the ridge portions 61a and 61b can also be formed by, for example, etching an n-type cladding layer or a second optical guiding layer laminated on a flat substrate.

FIG. 20 shows cross-sectional views of the configuration of a semiconductor laser element 3e as a modification of the semiconductor laser element 3d according to the present fourth embodiment. The area (a) of FIG. 20 is a cross-sectional view of the semiconductor laser element 3e corresponding to the cross-section V-V shown in FIG. 18, and the area (b) of FIG. 20 is a cross-sectional view of the semiconductor laser element 3e corresponding to the cross-section VI-VI shown in FIG. 18.

The difference between the semiconductor laser element 3e according to the present modification and the semiconductor laser element 3d according to the above-described fourth embodiment is the arrangement of the current concentrating means. In the semiconductor laser element 3e, no insulating film 58 is provided as in the fourth embodiment and no low-resistance region 56a is formed in the p-type cladding layer 56. In the semiconductor laser element 3e, there is formed a high-resistance region 63 instead of such current concentrating means. The high-resistance region 63 is formed on the p-type cap layer 57 side in the first semiconductor portion 60 excluding the areas above the ridge portions 61a and 61b. The high-resistance region 63 is formed by, for example, injecting a proton into the first semiconductor portion 60. In the semiconductor laser element 3e, when a current is concentrated on the area in the active layer 54 above the ridge portions 61a and 61b by the high-resistance region 63 as current concentrating means, there is generated a waveguide region 6 in the active layer 54.

In the semiconductor laser element 3e according to the present modification, the total reflection critical angle $\theta_{ca}$ ($\theta_{cb}$) can be set arbitrarily by adjusting the height of the side surfaces 61g to 61j of the ridge portion 61a (61b), as is the case with the semiconductor laser element 3d according to the above-described fourth embodiment. Alternatively, the total reflection critical angle $\theta_{ca}$ ($\theta_{cb}$) can be set arbitrarily by adjusting the material composition of the first optical guiding layer 55 and n-type cladding layer 56.

The total reflection critical angle $\theta_{ca}$ ($\theta_{cb}$) at the side surfaces 6g and 6h (or side surfaces 6i and 6j) depends also on the spacing between the high-resistance region 63 and the active layer 54. Therefore, the total reflection critical angle $\theta_{ca}$ ($\theta_{cb}$) can be set arbitrarily by adjusting the spacing between the high-resistance region 63 and the active layer 54, respectively, along the ridge portions 61a and 61b. It is noted that the spacing between the high-resistance region 63 and the active layer 54 can be adjusted by, for example, controlling the injection depth of the proton into the first semiconductor portion 60.

Fifth Embodiment

Figure 21:
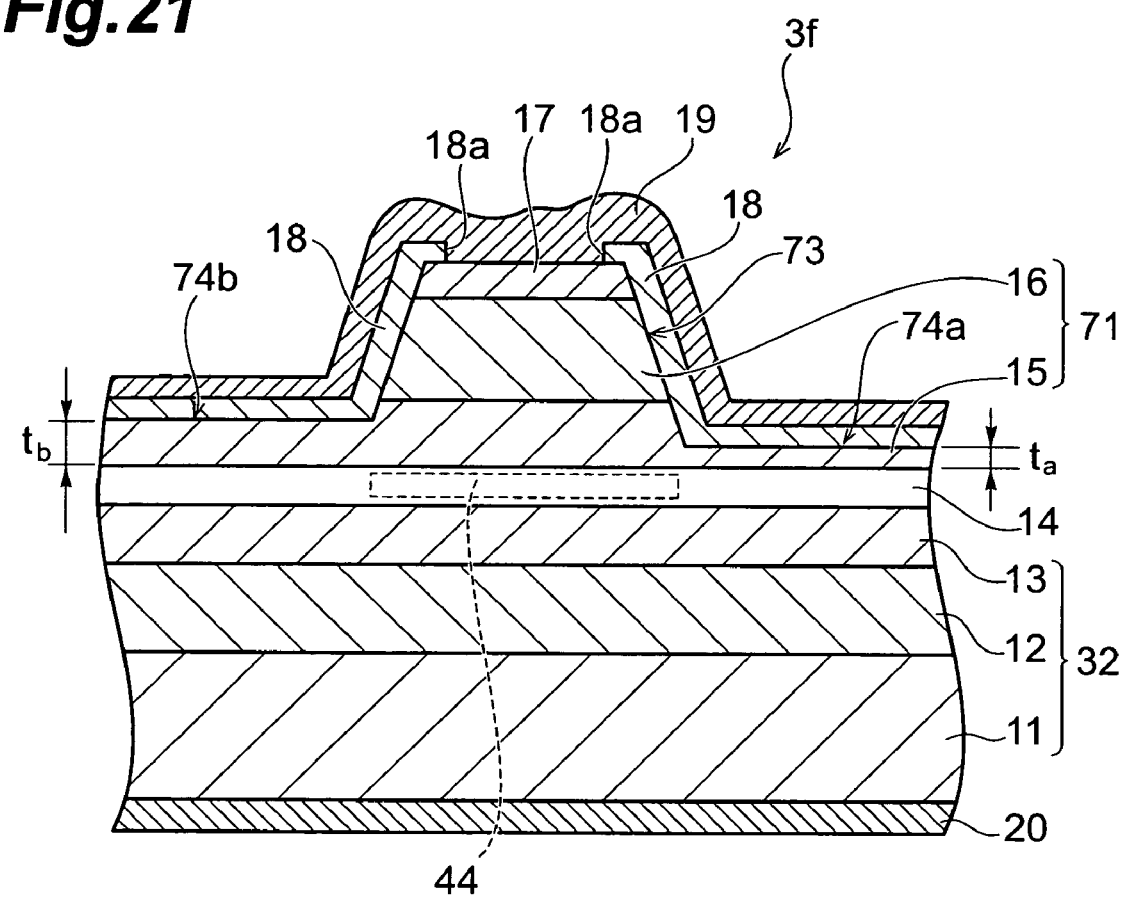
FIG. 21 is a cross-sectional view showing the configuration of a fifth embodiment of a semiconductor laser element according to the present invention.

Next will be explained a semiconductor laser element according to a fifth embodiment of the present invention. FIG. 21 is a cross-sectional view showing the configuration of the semiconductor laser element 3f according to the present fifth embodiment. The difference between the semiconductor laser element 3f according to the fifth embodiment and the semiconductor laser element 3 according to the first embodiment is the arrangement of the first semiconductor portion 71. Since the components of the semiconductor laser element 3f other than the first semiconductor portion 71 are identical to those of the semiconductor laser element 3 according to the first embodiment, detailed descriptions thereof will be omitted. It is noted that the semiconductor laser element 3f according to the present fifth embodiment can also be applied to such a semiconductor laser element array as shown in FIG. 2.

Figure 22:
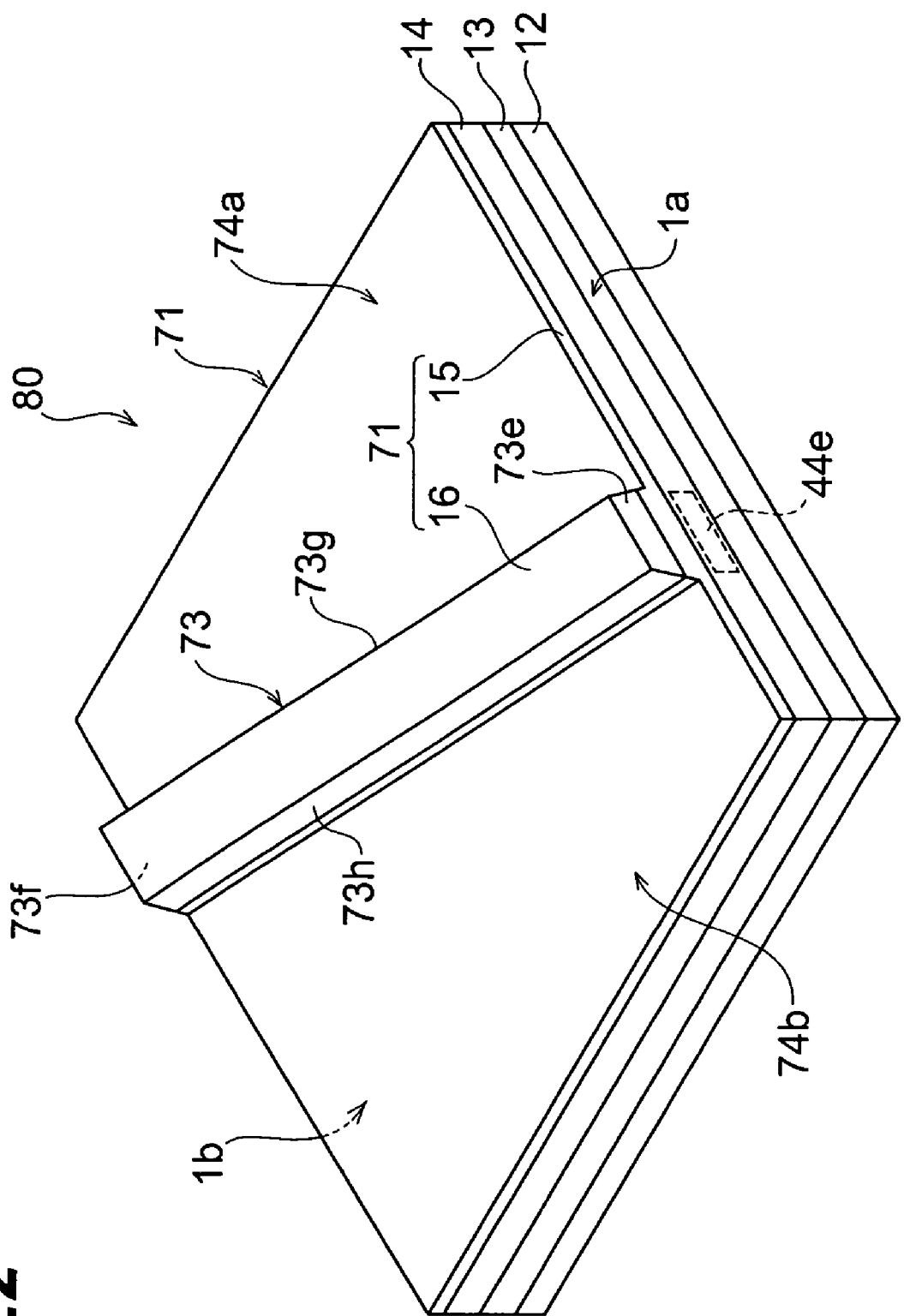
FIG. 22 is a perspective view showing a laminated body including a first semiconductor portion.
Figure 23:
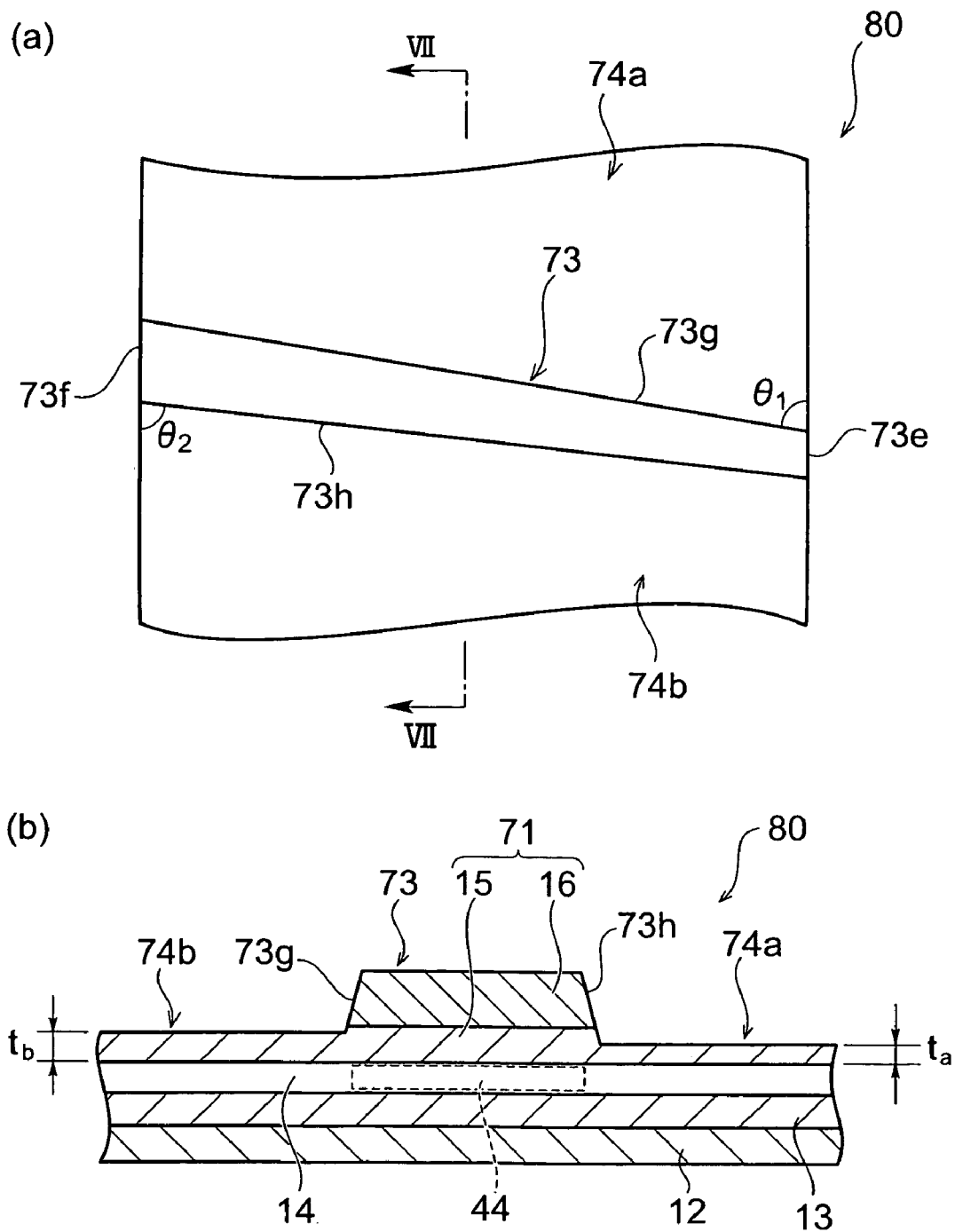
FIG. 23 shows a plan view of the laminated body and a cross-sectional view of the cross-section VII-VII thereof.

Here will be explained the first semiconductor portion 71 with reference to FIGS. 22 and 23. Both FIGS. 22 and 23 are views showing the configuration of a laminated body including the first semiconductor portion 71. In particular, FIG. 22 is a perspective view showing the configuration of the laminated body 80 including the first semiconductor portion 71, and the area (a) of FIG. 23 is a plan view of the laminated body 80. Also, the area (b) of FIG. 23 is a cross-sectional view showing the cross-section VII-VII of the laminated body 80 shown in the area (a) of FIG. 23. The laminated body 80 is composed of an n-type cladding layer 12, a second optical guiding layer 13, an active layer 14, and the first semiconductor portion 71. The first semiconductor portion 71 is provided on the active layer 14 and includes a first optical guiding layer 15 and a p-type cladding layer 16.

The first semiconductor portion 71 has a convex ridge portion 73 across the light emitting surface 1a and light reflecting surface 1b. One end face 73e of the ridge portion 73 is on the light emitting surface 1a. The other end face 73f of the ridge portion 73 is on the light reflecting surface 1b. The first semiconductor portion 71 also has a thin portion 74a along one side surface 73g of the ridge portion 73 and a thin portion 74b along the other side surface 73h of the ridge portion 73. The thin portions 74a and 74b are formed by etching the first semiconductor portion 71. Then, the thickness $t_b$ of the thin portion 74b is made greater than the thickness $t_a$ of the thin portion 74a by adjusting the etching time.

The side surface 73g of the ridge portion 73 is provided to have a relative angle of $\theta_1$ to the light emitting surface 1a and light reflecting surface 1b when viewed from above in the thickness direction. Also, the side surface 73h is provided to have a relative angle of $\theta_2$ ($\neq \theta_1$) to the light emitting surface 1a and light reflecting surface 1b when viewed from above in the thickness direction.

Figure 24:
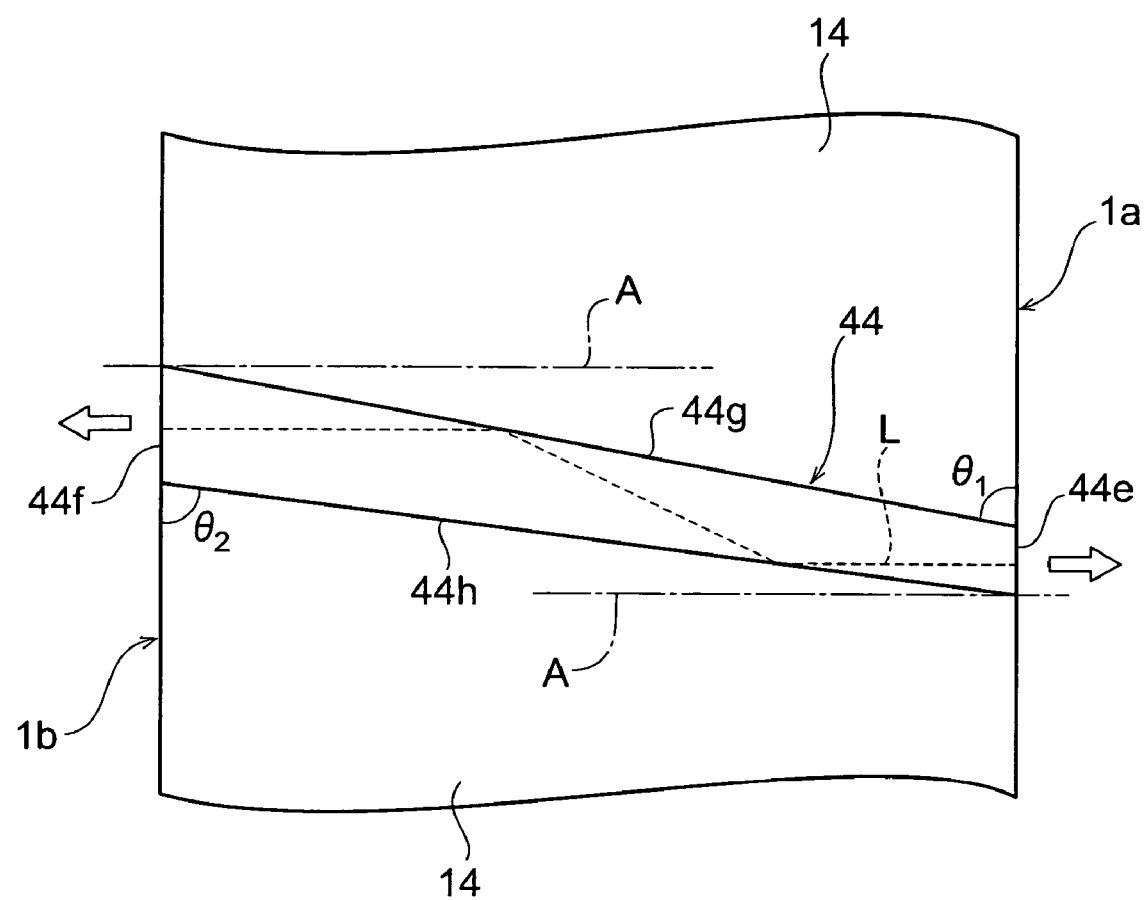
FIG. 24 is a plan view showing a waveguide region formed in an active layer.

In the active layer 14, there is formed a refractive index type waveguide region 44 correspondingly to the shape of the ridge portion 73. Here, FIG. 24 is a plan view of the waveguide region 44 formed in the active layer 14. The waveguide region 44 is a refractive index type one formed by the effective refractive index distribution in the active layer 14 due to current application to the ridge portion 73. In the present fifth embodiment, a laser beam emitting end 44e and a laser beam reflecting end 44f are formed in the waveguide region 44 correspondingly to the respective end faces 73e and 73f of the ridge portion 73. Also, a pair of side surfaces 44g and 44h are formed in the waveguide region 44 correspondingly to the respective side surfaces 73g and 73h of the ridge portion 73. The side surfaces 44g and 44h form one and another portions among the side surfaces of the waveguide region 44 in the present fifth embodiment. The laser beam emitting end 44e and laser beam reflecting end 44f are parts of cleavage surfaces in the active layer 14 that serve as resonating surfaces for laser beams L. Also, the side surfaces 44g and 44h are generated by the refractive index difference between the inside and outside of the waveguide region 44 and may respectively have a constant thickness if the refractive index varies continuously. The side surfaces 44g and 44h function as reflecting surfaces for selectively transmitting or reflecting laser beams L generated in the waveguide region 44 depending on the incident angle onto the respective side surfaces.

The relative angle $\theta_1$ between the side surface 44g of the waveguide region 44 and the light emitting surface 1a and light reflecting surface 1b (i.e. the relative angle $\theta_1$ between the side surface 73g of the ridge portion 73 and the light emitting surface 1a and light reflecting surface 1b) is decided based on the total reflection critical angle $\theta_{ca}$ at the side surface 44g of the waveguide region 44. The total reflection critical angle $\theta_{ca}$ depends on the thickness $t_a$ of the thin portion 74a in the first semiconductor portion 71. Since the relative angle $\theta_1$ is decided based on the total reflection critical angle $\theta_{ca}$, the side surface 44g of the waveguide region 44 is adapted to totally reflect laser beams L incident from the light reflecting surface 1b side along the direction of the predetermined axis A.

Also, the relative angle $\theta_2$ between the side surface 44h of the waveguide region 44 and the light emitting surface 1a and light reflecting surface 1b (i.e. the relative angle $\theta_2$ between the side surface 73h of the ridge portion 73 and the light emitting surface 1a and light reflecting surface 1b) is decided based on the total reflection critical angle $\theta_{cb}$ at the side surface 44h of the waveguide region 44. Here, although the total reflection critical angle $\theta_{cb}$ depends on the thickness $t_b$ of the thin portion 74b in the first semiconductor portion 71, since the thickness $t_a$ of the thin portion 74a and the thickness $t_b$ of the thin portion 74b are different from each other, the total reflection critical angle $\theta_{cb}$ at the side surface 44h is different from the total reflection critical angle $\theta_{ca}$ at the side surface 44g. Since the relative angle $\theta_2$ is decided based on the total reflection critical angle $\theta_{cb}$, the side surface 44h of the waveguide region 44 is adapted to totally reflect laser beams L incident from the light emitting surface 1a side along the direction of the predetermined axis A. It is noted that in order to absorb variations in the total reflection critical angles $\theta_{ca}$ and $\theta_{cb}$ due to temperature change, etc., the difference $\theta_1 - \theta_{ca}$ (=$\Delta\theta_1$) between $\theta_1$ and $\theta_{ca}$ and the difference $\theta_2 - \theta_{cb}$ (=$\Delta\theta_2$) between $\theta_2$ and $\theta_{cb}$ are set at some predetermined size.

As shown in FIG. 24, laser beams L reflected approximately perpendicularly at the laser beam reflecting end 44f along the direction of the predetermined axis A are incident on the side surface 44g at an angle of $\theta_1$ and then reflected totally thereat. Then, the laser beams L are incident on the side surface 44h at an angle of $\theta_2$ and then reflected totally thereat. Thus, the laser beams L reflected totally at the side surfaces 44g and 44h travel along the direction of the predetermined axis A to reach the laser beam emitting end 44e. A part of the laser beams L reaching the laser beam emitting end 44e passes (transmits) through the laser beam emitting end 44e to be emitted outward. The other part of the laser beams L is reflected approximately perpendicularly at the laser beam emitting end 44e along the direction of the predetermined axis A, and then reflected totally at the side surfaces 44g and 44h again. Then, the other part of the laser beams L thus reflected totally is returned to the laser beam reflecting end 44f. Thus, the laser beams L in the waveguide region 44 travel back and forth between the laser beam emitting end 44e and laser beam reflecting end 44f to result in resonance.

In the waveguide region 44, since the difference $\theta_1 - \theta_{ca}$ between $\theta_1$ and $\theta_{ca}$ is set at some predetermined size, the angular range of laser beams L reflectable at the side surface 44g has a constant width of $2\Delta\theta_1$ (refer to the area (a) of FIG. 10). Since the difference $\theta_2 - \theta_{cb}$ between $\theta_2$ and $\theta_{cb}$ is also set at some predetermined size, the angular range of laser beams L reflectable at the side surface 44h has a constant width of $2\Delta\theta_2$ (refer to the area (b) of FIG. 10). Then, as mentioned above, since the total reflection critical angle $\theta_{ca}$ at the side surface 44g and the total reflection critical angle $\theta_{cb}$ at the side surface 44h are different from each other, when the differences $\theta_1 - \theta_{ca}$ and $\theta_2 - \theta_{cb}$ are set at approximately the same value, the angular range is to be shifted mutually by the difference between the total reflection critical angle $\theta_{ca}$ and the total reflection critical angle $\theta_{cb}$. Since the laser beam L resonating in the waveguide region 44 is filtered at both the side surfaces 44g and 44h, the filtering characteristics of the entire waveguide region 44 is obtained by combining the filtering characteristics of the side surface 44g and the filtering characteristics of the side surface 44h. Therefore, the angular range of the laser beam L resonating in the waveguide region 44 has a width of $2\Delta\theta_3$ that is narrower than $2\Delta\theta_1$ or $2\Delta\theta_2$ (refer to the area (c) of FIG. 10).

As described heretofore, in accordance with the semiconductor laser element 3f according to the fifth embodiment, the angular range of laser beams L can be restricted narrower, as is the case with the semiconductor laser element 3 according to the first embodiment. It is therefore possible to achieve laser oscillation with the space transverse mode being approximately single (space transverse single mode). Also, the intensity distribution of laser beams L emitted from the laser beam emitting end 44e is deflected to the vicinity of the direction parallel to that of the predetermined axis A, and the emitted pattern thereof is single-peaked. Further, the horizontal emitting angle of laser beams L can be made narrower by widening the waveguide region 44, and it is possible to emit laser beams L with a higher intensity.

It is noted that in the present fifth embodiment, the side surfaces 44g and 44h having relative angles of $\theta_1$ and $\theta_2$ to the light emitting surface 1a and light reflecting surface 1b extend all across the waveguide region 44, but only a part of the waveguide region 44 may have a relative angle based on total reflection critical angle to the light emitting surface 1a and light reflecting surface 1b. Even in such an arrangement, the angular range of laser beams L can be restricted narrower.

Meanwhile, the semiconductor laser element disclosed in Patent Document 3 is one for oblique light emitting, in which the refractive index on either side of the laser active region (i.e. waveguide region) is made asymmetric to emit laser beams in an oblique direction from the laser active region that is perpendicular to resonating surfaces (light emitting surface and light reflecting surface). Therefore, this device is completely different from the semiconductor laser element 3f in that there is no correlation between, at least, relative angle and total reflection critical angle at the side surfaces of the waveguide region.

The semiconductor laser element and semiconductor laser element array according to the present invention are not restricted to the arrangements disclosed in the above-described embodiments and the modifications thereof, and some other various modifications may be made. For example, the structure of the semiconductor laser element is not restricted to ridge-type or buried-heterostructure, though represented in the above-described embodiments. The present invention is applicable as long as the semiconductor laser element and semiconductor laser element array have a waveguide region. In addition, although GaAs type semiconductor laser elements are exemplified in the above-described embodiments, the arrangement of the present invention is applicable to semiconductor laser elements of other material types such as GaN and InP.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

INDUSTRIAL APPLICABILITY

The semiconductor laser element according to the present invention is applicable to various luminescent devices capable of emitting laser beams having relatively high intensity and small emitting angle efficiently with a simpler structure.

The invention claimed is:

1. A semiconductor laser element comprising:
a first semiconductor portion including a first conductivity type semiconductor layer;
a second semiconductor portion including a second conductivity type semiconductor layer;
an active layer provided between said first semiconductor portion and said second semiconductor portion;
a light emitting surface corresponding to one end face of said active layer;
a light reflecting surface corresponding to the other end face of said active layer, which is opposed to the one end face, and arranged in such a manner that a first normal line that passes through the center thereof is substantially parallel with a second normal line that passes through the center of said light emitting surface; and
a waveguide region formed in the active layer for communicating between said light reflecting surface and said light emitting surface,
wherein said waveguide region includes, at least, first and second portions having respective different total reflection critical angles at the side surfaces thereof,
wherein each of said first and second portions is arranged in the position where the relative angles of the side surfaces thereof to said light reflecting surface and said light emitting surface is greater than the total reflection critical angles at the side surfaces, and
wherein the relative angles of the side surfaces of said first portion to said light reflecting surface and said light emitting surface is different from the relative angles of the side surfaces of said second portion.

2. A semiconductor laser element according to claim 1, wherein said waveguide region includes a plurality of portions each defined by a pair of side surfaces,
wherein the total reflection critical angle at each side surface defining said plurality of portions are different from each other, and
wherein each of said plurality of portions is arranged in the position where the relative angles of the side surfaces thereof to said light emitting surface and said light reflecting surface is greater than the total reflection critical angles at the side surfaces.

3. A semiconductor laser element according to claim 2, wherein a length of each of said plurality of portions and a spacing between the pair of side surfaces are set in such a manner that light resonating in said waveguide region, which is formed between said light emitting surface and said light reflecting surface, is reflected at each of the pair of side surfaces by the same number of times.

4. A semiconductor laser element according to claim 2, wherein said waveguide region further includes one or more intermediate portions positioned, respectively, between said plurality of portions, and
wherein each of said intermediate portions in said waveguide region is arranged in such a manner that the side surfaces thereof are substantially parallel with the first and second normal lines.

5. A semiconductor laser element comprising:
a first semiconductor portion including a first conductivity type semiconductor layer;
a second semiconductor portion including a second conductivity type semiconductor layer;
an active layer provided between said first semiconductor portions and said second semiconductor portion;
a light emitting surface corresponding to one end face of said active layer;
a light reflecting surface corresponding to the other end face of said active layer, which is opposed to the one end face, and arranged in such a manner that a first normal line that passes through the center thereof is substantially parallel with a second normal line that passes through the center of said light emitting surface; and
a waveguide region formed in said active layer for communicating between said light reflecting surface and said light emitting surface,
wherein the total reflection critical angle at one of a pair of side surfaces defining said waveguide region is different from that at the other side surface,
wherein said waveguide region is arranged in such a manner that the relative angle of the one side surface to said light reflecting surface and said light emitting surface is greater than the total reflection critical angle at the one side surface, and that the relative angle of the other side surface to said light reflecting surface and said light emitting surface is greater than the total reflection critical angle at the other side surface, and wherein the relative angle of the one side surface to said light reflecting surface and said light emitting surface is different from the relative angle of the other side surface to said light reflecting surface and said light emitting surface.

6. A semiconductor laser element according to claim 1, wherein said first semiconductor portion comprises a ridge portion for generating a refractive index type waveguide region in said active layer, and a thin portion adjacent to said ridge portion, and wherein the total reflection critical angles at the side surfaces of said waveguide region are controlled by adjusting the thickness of said thin portion.

7. A semiconductor laser element according to claim 1, wherein said first semiconductor portion comprises a ridge portion for generating a refractive index type waveguide region in said active layer, wherein said semiconductor laser element further comprising current blocking portions provided along the side surfaces of said ridge portion to apply a current to said ridge portion, and wherein the total reflection critical angles at the side surfaces of said waveguide region are controlled by adjusting the material composition of said current blocking portions.

8. A semiconductor laser element according to claim 1, wherein said second semiconductor portion comprises a ridge portion for generating said waveguide region in said active layer, wherein said active layer and said first semiconductor portion are laminated on said second semiconductor portion including said ridge portion, wherein said semiconductor laser element further comprising current concentrating means, provided on said active layer, for applying a current to a part of said active layer that is positioned above said ridge portion, and wherein the total reflection critical angles at the side surfaces of said waveguide region are controlled by adjusting the height of side surfaces defining said ridge portion.

9. A semiconductor laser element according to claim 1, wherein said active layer has sidewalls for defining the side surfaces of said waveguide region, wherein said semiconductor laser element further comprising current blocking portions, provided along the sidewalls of said active layer, for applying a current to said active layer, and wherein the total reflection critical angles at the side surfaces of said waveguide region are controlled by adjusting the refractive index difference between said active layer and said current blocking portions.

10. A semiconductor laser element array comprising a plurality of semiconductor laser elements each having the same structure as a semiconductor laser element according to claim 1, wherein said plurality of semiconductor laser elements are arranged in the direction intersecting with the first and second normal lines.

11. A semiconductor laser element according to claim 5, wherein said first semiconductor portion comprises a ridge portion for generating a refractive index type waveguide region in said active layer, and a thin portion adjacent to said ridge portion, and wherein the total reflection critical angles at the side surfaces of said waveguide region are controlled by adjusting the thickness of said thin portion.

12. A semiconductor laser element according to claim 5, wherein said first semiconductor portion comprises a ridge portion for generating a refractive index type waveguide region in said active layer, wherein said semiconductor laser element further comprising current blocking portions provided along the side surfaces of said ridge portion to apply a current to said ridge portion, and wherein the total reflection critical angles at the side surfaces of said waveguide region are controlled by adjusting the material composition of said current blocking portions.

13. A semiconductor laser element according to claim 5, wherein said second semiconductor portion comprises a ridge portion for generating said waveguide region in said active layer, wherein said active layer and said first semiconductor portion are laminated on said second semiconductor portion including said ridge portion, wherein said semiconductor laser element further comprising current concentrating means, provided on said active layer, for applying a current to a part of said active layer that is positioned above said ridge portion, and wherein the total reflection critical angles at the side surfaces of said waveguide region are controlled by adjusting the height of side surfaces defining said ridge portion.

14. A semiconductor laser element according to claim 5, wherein said active layer has sidewalls for defining the side surfaces of said waveguide region, wherein said semiconductor laser element further comprising current blocking portions, provided along the sidewalls of said active layer, for applying a current to said active layer, and wherein the total reflection critical angles at the side surfaces of said waveguide region are controlled by adjusting the refractive index difference between said active layer and said current blocking portions.

15. A semiconductor laser element array comprising a plurality of semiconductor laser elements each having the same structure as a semiconductor laser element according to claim 5, wherein said plurality of semiconductor laser elements are arranged in the direction intersecting with the first and second normal lines.

* * * * *